(12) United States Patent
Kondo et al.

(10) Patent No.: US 10,079,209 B2
(45) Date of Patent: Sep. 18, 2018

(54) GRAPHENE FILM MANUFACTURING METHOD AND SEMICONDUCTOR DEVICE MANUFACTURING METHOD

(71) Applicant: FUJITSU LIMITED, Kawasaki-shi, Kanagawa (JP)

(72) Inventors: Daiyu Kondo, Atsugi (JP); Haruhisa Nakano, Tsuchiura (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/631,033

(22) Filed: Feb. 25, 2015

(65) Prior Publication Data

US 2015/0249034 A1   Sep. 3, 2015

(30) Foreign Application Priority Data

Feb. 28, 2014   (JP) .................. 2014-038895

(51) Int. Cl.
*H01L 21/762* (2006.01)
*H01L 23/532* (2006.01)
(Continued)

(52) U.S. Cl.
CPC .... *H01L 23/53276* (2013.01); *H01L 21/0262* (2013.01); *H01L 21/02491* (2013.01); *H01L 21/02527* (2013.01); *H01L 21/043* (2013.01); *H01L 21/044* (2013.01); *H01L 21/28512* (2013.01); *H01L 29/1606* (2013.01); *H01L 29/66045* (2013.01); *H01L 29/66742* (2013.01); *H01L 29/778* (2013.01); *H01L 29/78684* (2013.01); *H01L 21/76885* (2013.01); *H01L 29/45* (2013.01); *H01L 29/49* (2013.01); *H01L 29/4966* (2013.01); *H01L 29/517* (2013.01);
(Continued)

(58) Field of Classification Search
CPC ........... H01L 29/1606; H01L 21/02527; H01L 23/53276; Y10S 977/734
USPC .......................................... 977/734; 438/151
See application file for complete search history.

(56) References Cited

U.S. PATENT DOCUMENTS 5,250,276 A * 10/1993 Knuuttila ............... C01G 49/10
423/138
9,768,288 B2 * 9/2017 Chu ...................... H01L 29/775
(Continued)

FOREIGN PATENT DOCUMENTS

| JP | 2013-530124 A | 7/2013 |
| JP | 2014-027166 A | 2/2014 |
| WO | WO 2008/108383 A1 | 9/2008 |

OTHER PUBLICATIONS

D. Kondo, et al.; "Intercalated multi-layer graphene grown by CVD for LSI interconnects;" Interconnect Technology Conference (IITC); 2013 IEEE International (3 Sheets)/p. 1 of specifcation.
(Continued)

*Primary Examiner* — Moazzam Hossain
(74) *Attorney, Agent, or Firm* — Kratz, Quintos & Hanson, LLC

(57) ABSTRACT

A method of manufacturing a graphene film manufactures a graphene film in good state without generating wrinkles and stresses and leaving residues of the resin. The method of manufacturing a graphene film comprises forming a catalyst metal film on a substrate; synthesizing a graphene film on the catalyst metal film; and removing the metal catalyst film in an oxidation atmosphere of an oxidizer and transferring the graphene film to the substrate.

14 Claims, 35 Drawing Sheets

(51) Int. Cl.
*H01L 29/16* (2006.01)
*H01L 29/66* (2006.01)
*H01L 21/285* (2006.01)
*H01L 21/768* (2006.01)
*H01L 21/02* (2006.01)
*H01L 21/04* (2006.01)
*H01L 29/778* (2006.01)
*H01L 29/786* (2006.01)
*H01L 29/45* (2006.01)
*H01L 29/49* (2006.01)
*H01L 29/51* (2006.01)

(52) U.S. Cl.
CPC ............ *H01L 2221/1094* (2013.01); *H01L 2924/0002* (2013.01)

(56) References Cited

U.S. PATENT DOCUMENTS

| | | | |
|---|---|---|---|
| 2010/0102292 A1 | 4/2010 | Hiura | |
| 2011/0033677 A1* | 2/2011 | Shin | B82Y 30/00 428/201 |
| 2011/0243830 A1* | 10/2011 | Ozaki | C01B 31/02 423/445 R |
| 2011/0285999 A1* | 11/2011 | Kim | G01N 21/552 356/445 |
| 2011/0308717 A1* | 12/2011 | Cho | B32B 37/025 156/249 |
| 2012/0256167 A1* | 10/2012 | Heo | H01L 29/1606 257/27 |
| 2013/0099194 A1* | 4/2013 | Maliakal | C01B 31/0446 257/9 |
| 2013/0099195 A1* | 4/2013 | Seacrist | H01L 21/283 257/9 |
| 2013/0105765 A1* | 5/2013 | Haensch | H01L 29/42364 257/29 |
| 2013/0187097 A1 | 7/2013 | Hong et al. | |
| 2013/0214252 A1* | 8/2013 | Park | B82Y 30/00 257/29 |
| 2013/0285092 A1* | 10/2013 | Wei | H01L 33/46 257/98 |
| 2013/0341792 A1* | 12/2013 | Noda | H01L 29/66742 257/741 |
| 2014/0014905 A1* | 1/2014 | Lee | H01L 29/78 257/29 |
| 2014/0014970 A1* | 1/2014 | Woo | H01L 21/02527 257/77 |
| 2014/0175554 A1* | 6/2014 | Loubet | H01L 21/823431 257/368 |
| 2014/0218867 A1* | 8/2014 | Kim | H05K 9/0088 361/704 |
| 2014/0284303 A1* | 9/2014 | Kim | B82Y 30/00 216/13 |
| 2014/0299975 A1* | 10/2014 | Cho | H01L 21/02664 257/629 |
| 2014/0339506 A1* | 11/2014 | Dimitrakopoulos | H01L 29/1606 257/29 |
| 2015/0214303 A1* | 7/2015 | Ruhl | H01L 29/1606 257/29 |
| 2015/0348666 A1* | 12/2015 | Na | B32B 9/007 252/510 |
| 2016/0176713 A1* | 6/2016 | Loh | H01L 21/02491 438/479 |

OTHER PUBLICATIONS

D. Kondo, et al.; "Low-Temperature Synthesis of Graphene and Fabrication of Top-Gated Field Effect Transistors without Using Transfer Processes;" Applied Physics Express 3; 2010; pp. 025102-1-025102-3 (3 Sheets)/pp. 1-2 of specification.

Japanese Patent Application No. 2014-038895: Notification of Reasons for Refusal dated Jul. 4, 2017.

* cited by examiner

GRAPHENE FILM MANUFACTURING METHOD AND SEMICONDUCTOR DEVICE MANUFACTURING METHOD

CROSS-REFERENCE TO RELATED APPLICATION

This application is based upon and claims the benefit of priority of the prior Japanese Patent Application No. 2014-038895, filed on Feb. 28, 2014, the entire contents of which are incorporated herein by reference.

FIELD

The embodiments discussed herein are related to a graphene film manufacturing method and a semiconductor device manufacturing method.

BACKGROUND

The CMOS technique using silicon is coming to the limit of the miniaturization, and its substitutive channel materials are being searched. As the most promising material, carbon materials represented by carbon nanotube and graphene are noted, and various researches and developments are being made.

As one of the devices using the nanocarbon material is the graphene transistor using graphene in the channel region of a field effect transistor. Graphene has a high carrier mobility in comparison with silicon, and by forming channels of graphene, high-speed transistors can be realized.

Related references are as follows:

International Publication No. WO 2008/108383.

Daiyu Kondo et al., "Intercalated Multi-Layer Graphene grown by CVD for LSI interconnects", Interconnect Technology Conference (IITC), 2013 IEEE International Daiyu Kondo et al., "Low-Temperature Synthesis of Graphene and Fabrication of Top-Gated Field Effect Transistors without Using Transfer Processes", Appl. Phys. Express 3 (2010) 025102

SUMMARY

According to an aspect of embodiments, a method of manufacturing a graphene film comprises: forming a catalyst metal film on a substrate; synthesizing a graphene film on the catalyst metal film; and removing the catalyst metal film in an oxidation atmosphere of an oxidizer and transferring the graphene film to the substrate.

According to another aspect of the embodiments, a method of manufacturing a graphene film comprises: synthesizing a graphene film on a catalyst metal film of foil; mounting the catalyst metal film of foil formed on the graphene film on a substrate; and removing the catalyst metal film in an oxidation atmosphere and transferring the graphene film to the substrate.

According to another aspect of the embodiments, a method of manufacturing a graphene film comprises: forming a catalyst metal film on a substrate; synthesizing a graphene film on the catalyst metal film; removing the catalyst metal film in an oxidation atmosphere of an oxidizer and transferring the graphene film to the substrate; mounting another substrate on the substrate with the graphene film transferred to; and removing the substrate in an oxidation atmosphere of an oxidizer and transferring the graphene film to said another substrate.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Since a metal catalyst is present immediately below monolayer graphene or multi-layer graphene formed by synthesis, the formed graphene is once transferred to a resin, such as PMMA (polymethylmethacrylate) and released from the metal catalyst, and then is transferred to a substrate such as an insulation film substrate, etc.

However, upon the transfer, wrinkles and stresses are generated on the graphene, residues of the resin of the PMMA or others remain, which often have seriously affected the graphene after transferred.

[a] First Embodiment

Figure 1:
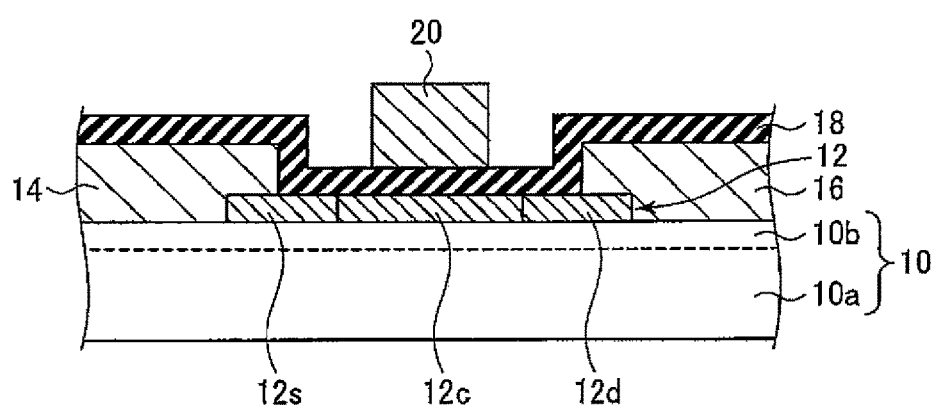
FIG. 1 is a view of the semiconductor device according to a first embodiment.

The semiconductor device according to a first embodiment and the method of manufacturing the semiconductor device will be described with reference to FIGS. 1 through 16C. FIG. 1 is a view of the semiconductor device according to the first embodiment. FIGS. 2A through 4B are sectional views of the semiconductor device according to the first embodiment in the manufacturing steps of a first example of its manufacturing method. FIGS. 5 to 7 are sectional views of the semiconductor device according to the first embodiment in the steps of a second example of the method of manufacturing the semiconductor device. FIGS. 8 to 10 are sectional views of the semiconductor device according to the first embodiment in the steps of a third example of the method of manufacturing the semiconductor device.

(Semiconductor Device)

The semiconductor device according to this embodiment will be described with reference FIG. 1.

The semiconductor device according to this embodiment is a TFT (thin film transistor) using graphene film in the channel.

The graphene film 12 is formed on a silicon substrate 10 with oxide film.

The silicon substrate 10 with the graphene film, for example, has an about 90 nm-thickness silicon oxide film 10b formed on an about 380 μm-thickness silicon oxide film 10b.

The graphene film 12 is formed of monolayer graphene (MLG) or few layer graphen (FLG). The thickness of the graphene film 12 is, e.g., 0.3-5.0 nm.

In the graphene film 12, a source region 12a and a drain region 12d are formed on both sides of the channel region 12c at the center.

The source region 12a and the drain region 12d are doped, for the n-TFT, with nitrogen or others, which is an n-dopant and, for the p-TFT, with boron or others, which is a p-dopant. As the dopant, gaseous molecules or organic molecules may be used.

On both sides of the graphene 12, a source electrode 14 and a drain electrode 16 are formed, connected respectively to the source region 12s and the drain region 12d.

The source electrode 14 and the drain electrode 16 are formed of, e.g., an Au/Ti film of an about 20 nm-thickness gold film stacked on an about 5 nm-thickness titanium film.

A gate electrode 20 is formed on the channel region 12c of the graphene film 12 with a gate insulation film 18 formed therebetween.

The gate insulation film 18 is formed of, e.g., an about 5 nm-thickness alumina ($Al_2O_3$) film.

The gate electrode 20 is formed of, e.g., an Au/Ti film of an about 20 nm-thickness gold film stacked on an about 5 nm-thickness titanium film.

A semiconductor device (not illustrated) of CMOS structure can be formed of the p-TFT and the n-TFT of the structure illustrated in FIG. 1.

(Semiconductor Device Manufacturing Method (a first example))

A first example of the semiconductor device manufacturing method according to this embodiment will be described with reference to FIGS. 2A through 4B.

The semiconductor device manufactured in this example is a thin film transistor using few layer graphene in the channel.

Figure 2A:
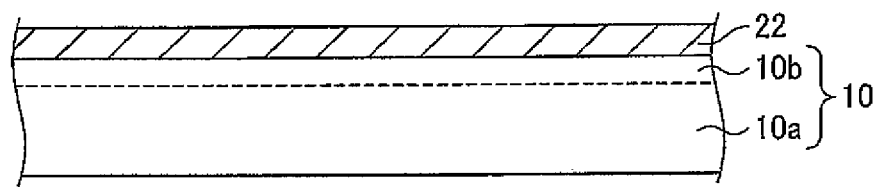
FIGS. 2A, 2B, and 2C are sectional views of the semiconductor device according to the first embodiment in the steps of a first example of the method of manufacturing the semiconductor device (Part 1)

First, a silicon substrate 10 with an oxide film is prepared (FIG. 2A). The silicon substrate 10 with the oxide film is, e.g., an about 380 m-thickness silicon substrate 10a with an about 90 nm-thickness silicon oxide film 10b.

Then, a catalyst metal film 22 formed of a metal to be the catalyst for the graphene is deposited on the silicon substrate 10 with oxide film (FIG. 2A). As the catalyst metal film 22, an about 200 nm-thickness cobalt film, for example, is deposited on the silicon substrate 10 with e oxide film by sputtering, electron beam vapor deposition or others.

Figure 2B:
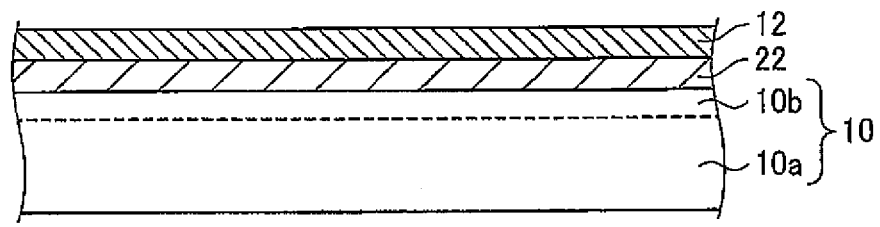

Then, on the catalyst metal film 22, a few layer graphene film 12 is synthesized on the catalyst metal film 22 (FIG. 2B). The few layer graphene film 12 is synthesized by thermal CVD of 1000 C. In the thermal CVD, for example, methane gas is used as the raw material, and as the dilution gas, hydrogen and argon are used. The flow rate of the argon gas is, e.g., 4000 sccm, and the flow rate of the hydrogen is, e.g., 500 sccm, the flow rate of the methane gas is, e.g., 50 sccm. Total pressure is, e.g., 500 mbar.

Then, the few layer graphene film 12 is synthesized, then the sample is loaded in a nitrogen atmosphere and is degassed sufficiently under a pressure of $10^{-2}$ pascal or below $10^{-2}$ pascal and for, e.g., 10 hours or more.

Figure 2C:
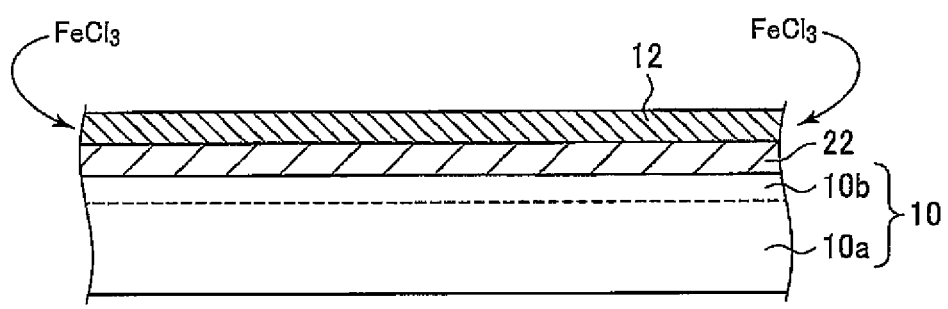

Then, the sample is loaded in an oxidation atmosphere of an oxidizer, e.g., an iron chloride content oxidation atmosphere using anhydrous iron chloride ($FeCl_3$) at, e.g., 310 C and for, e.g., 12-24 hours (FIG. 2C).

Figure 3A:
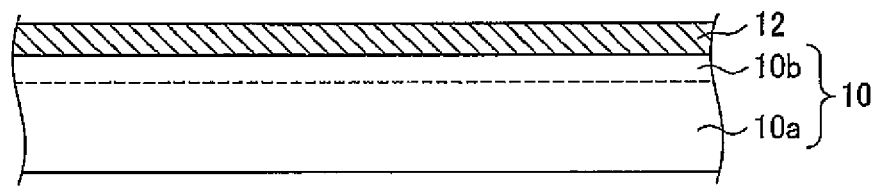
FIGS. 3A, 3B, and 3C are sectional views of the semiconductor device according to the first embodiment in the steps of the first example of the method of manufacturing the semiconductor device (Part 2)

Thus, the catalyst metal film 22 is removed by the iron chloride, and the graphene film 12 is transferred to the silicon substrate 10 while the molecules of the iron chloride intrude into the film of the few layer graphene film 12, intercalated and doped (FIG. 2C, FIG. 3A). At this time, when the intercalated iron chloride is unnecessary, the sample is held in vacuum at about 500 C, whereby the intercalated iron chloride is removed.

Thus, the catalyst metal film 22 is removed by the iron chloride, and the graphene film 12 is transferred to the silicon substrate 10 while the molecules of the iron chloride intrude into the film of the few layer graphene film 12, intercalated and doped (FIG. 2C, FIG. 3A).

Figure 3B:
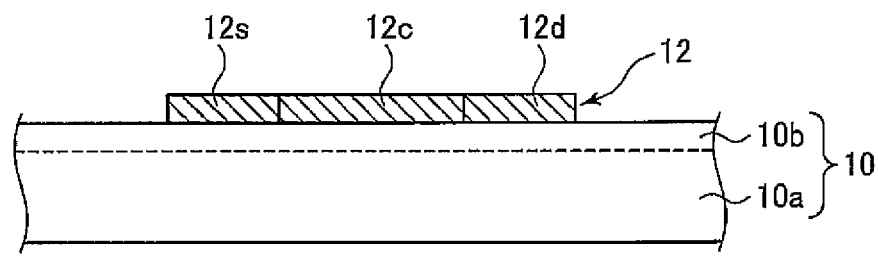

Then, the graphene film 12 is patterned into a channel configuration of the TFT to be manufactured (FIG. 3B). The graphene film 12 is patterned, e.g., by photolithography or electron-beam lithography. The patterning configuration of the graphene film 12 is, for the channel, may be within the range of, e.g., 0.5-1000 nm channel width and is preferably within the range of 1.0-20 nm. To develop and then remove the graphene film 12 for processing, the sample is subjected to ashing or heating processing in oxygen.

When the graphene film 12 is removed by ashing with oxygen plasma, the sample is loaded in a plasma of, e.g., about 300 W for, e.g., several minutes—10 s minutes in an oxygen atmosphere of about atmospheric pressure. The graphene film 12 may be removed by RIE (Reactive Ion Etching) using a gas plasma containing oxygen plasma.

In removing the graphene film 12 by the heating processing in oxygen atmosphere, the example is loaded in, e.g., an oxygen atmosphere of 1000 pascal, at, e.g., 500-600 C for 1-60 minutes.

In advance of the oxygen plasma processing or the heating processing, excessive iron chloride and iron oxide adhering to the graphene film 12 are removed by, e.g., pure water rinse or a rust removing gent?

Then, an impurity is doped to form the source region 12s and the drain region 12d on both sides of the channel region 12c at the center (FIG. 3B).

For the n-TFT, nitrogen or others, which is an n-dopant, is doped to form the n-source region 12s and the n-drain region 12d. For the p-TFT, boron or others, which is a p-dopant, is doped to form the p-source region 12s and the p-drain region 12d.

In addition to the doping by the atomic substitution, the doping may be made by molecule absorption or the intercalation of molecules and atoms between the graphene layers. For example, the p-dopant molecule is 9,10-dibromoanthracene (An-Br), and the n-dopant molecule is 1,5-naphthalenediamine (Na—NH2).

Then, on the entire surface, an Au/Ti film (not illustrated) is formed by, e.g., electron beam vapor deposition. For example, an about 5 nm-thickness titanium film by electron beam vapor deposition, and on the titanium film, an about 20 nm-thickness gold film is stacked.

Figure 3C:
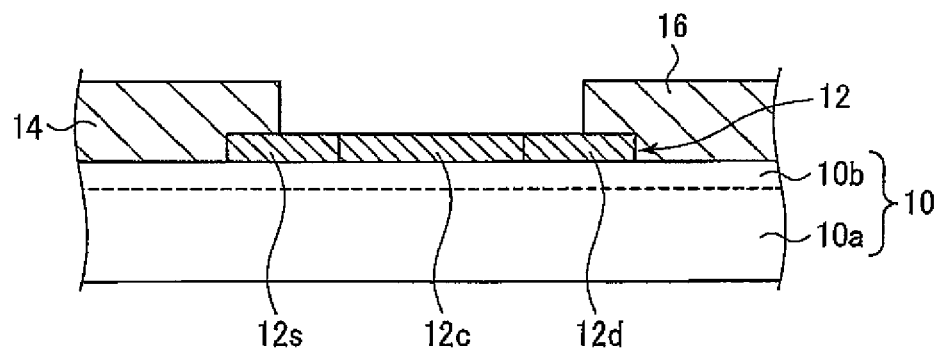

Next, the Au—Ti film is patterned by, e.g., photolithography to form the source electrode 14 and the drain electrode 16 respectively contacted to the source region 12s and the drain region 12d (FIG. 3C).

Figure 4A:
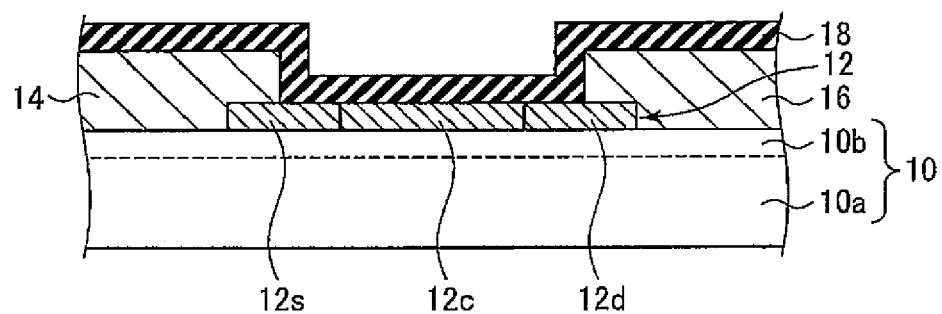
FIGS. 4A and 4B are sectional views of the semiconductor device according to the first embodiment in the steps of the first example of the method of manufacturing the semiconductor device (Part 3)

Next, on the entire surface, an insulation film is deposited by, e.g., ALD (Atomic Layer Deposition) (FIG. 4A). The insulation film 18 is, e.g., an about 5 nm-thickness alumina ($Al_2O_3$).

Next, on the entire surface, an Au/Ti film (not illustrated) is formed by, e.g., electron beam vapor deposition. For example, by an about 5 nm-thickness titanium film is formed, and on the titanium film, an about 20 nm-thickness gold film is stacked.

Figure 4B:
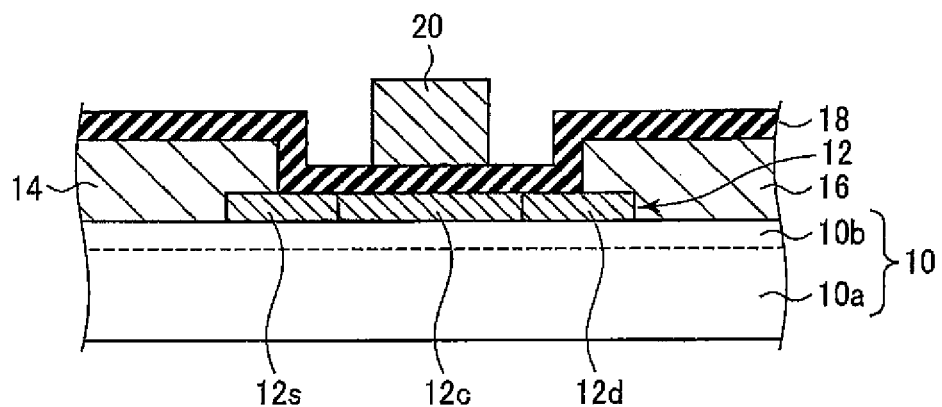

Then, the Au/Ti film is patterned by, e.g., photolithography to form a gate electrode 29 (FIG. 4B).

As described above, the thin film transistor using the graphene film in the channel is manufactured.

(Semiconductor Device Manufacturing Method (a second example))

A second example of the semiconductor device manufacturing method according to this embodiment will be described with reference to FIGS. 5A through 7B. The same constituent members of the second example as those of the first example illustrated in FIGS. 2A through 4B are represented by the same reference numbers, and their explanation will not be repeated or simplified.

The semiconductor device to be manufactured by this example is a thin film transistor using MLG (Monolayer Graphene) or FLG (Few Layer graphene) in the channel.

Figure 5A:
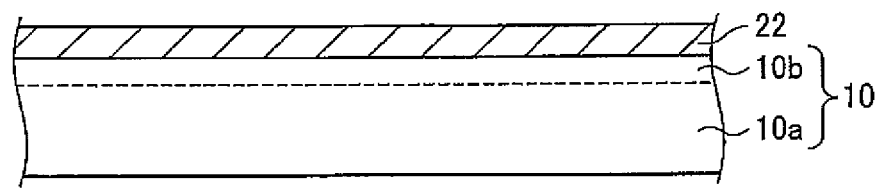
FIGS. 5A, 5B, and 5C are sectional views of the semiconductor device according to the first embodiment in the steps of a second example of the method of manufacturing the semiconductor device (Part 1)

First, a silicon substrate 10 with an oxide film is prepared (FIG. 5A).

Next, on the silicon substrate 10 with the oxide film, a catalyst metal film 22 formed of a metal to be the catalyst of the graphene is deposited (FIG. 5A). As the catalyst metal film 22, an about 500 nm-thickness iron film, for example, is deposited on the silicon substrate 10 with the oxide film by sputtering, electron beam vapor deposition or others.

Figure 5B:
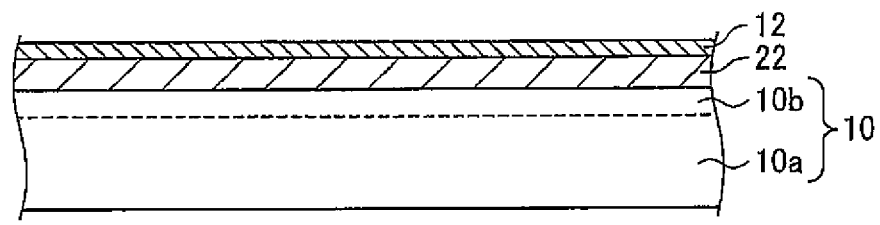

Then, on the catalyst metal film 22, a monolayer or a few layer graphene film 12 is synthesized (FIG. 5B). The monolayer or the few layer graphene film 12 is synthesized by, e.g., thermal CVD at 650 C.

The monolayer graphene film 12 is synthesized by thermal CVD using, e.g., the mixed gas of acetylene (by 10%) and argon as the raw material gas, and argon as the dilution gas. The flow rate ratio of the raw material gas and the dilution gas is, e.g., 1000 vs. 0.02.

The few layer graphene film 12 is synthesized by thermal CVD using, e.g., the mixed gas of acetylene (by 10%) and argon as the raw material gas, and argon as the dilution gas. The flow rate ratio of the raw material gas and the dilution gas is, e.g., 1000 vs. 0.5.

Next, after the monolayer or the few layer graphene film 12 has been synthesized, the sample is loaded in a nitrogen atmosphere to be sufficiently degassed under, e.g., $10^{-2}$ pascal or below $10^{-2}$ pascal and for, e.g., 12 hours or more.

Figure 5C:
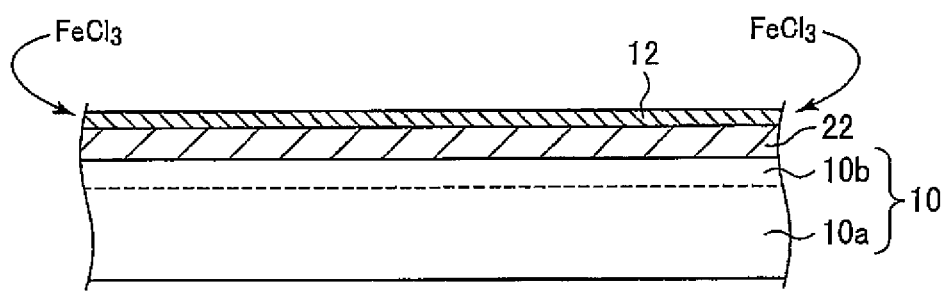

Then, the sample is loaded in an oxidation atmosphere of an oxidizer, e.g., an iron chloride-content oxidation atmosphere using anhydrous iron chloride at, e.g., 310 C and for, e.g., 6-24 hours (FIG. 5C).

Figure 6A:
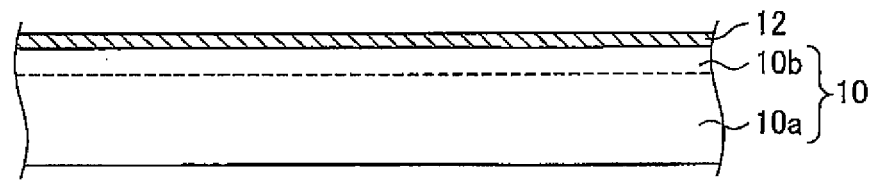
FIGS. 6A, 6B, and 6C are sectional views of the semiconductor device according to the first embodiment in the steps of the second example of the method of manufacturing the semiconductor device (Part 2)

Thus, the catalyst metal 22 is removed by the iron chloride, and the graphene film 12 is transferred to the silicon substrate 10 while the molecules of the iron chloride intrude into the film of the few layer graphene film 12, intercalated and doped (FIG. 5C, FIG. 6A).

At this time, when the intercalation with the iron chloride molecules is unnecessary, the doping material is removed by heating processing of 400 C or more in vacuum.

Figure 6B:
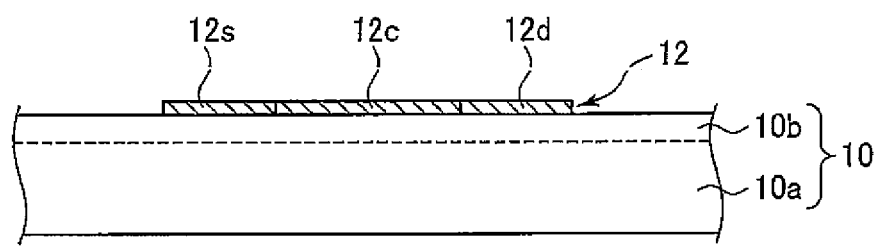

Then, the graphene film 12 is pattered in the channel configuration of the TFT to be manufactured (FIG. 6B). The graphene film 12 is patterned by, e.g., photolithography or electron beam lithography.

The graphene film 12 is removed by, e.g., oxygen plasma processing or heating processing to be patterned.

In advance of the oxygen plasma processing or the heating processing, excessive iron chloride and iron oxide adhering to the graphene film 12 are removed by, e.g., pure water rinse or a rust removing gent?

Then, an impurity is dopes to form a source region 12s and a drain region 12d on both sides of the channel region 12c at the center (FIG. 6B).

Next, on the entire surface, an Au/Ti film (not illustrated) is formed by, e.g., electron beam vapor deposition.

Figure 6C:
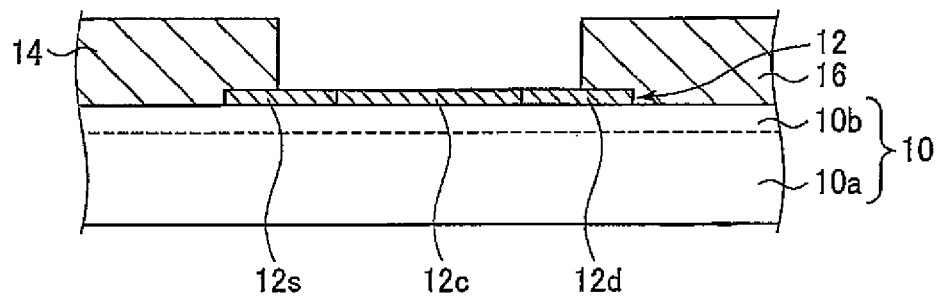

Then, the Au/Ti film is patterned by, e.g., photolithography to form a source electrode 14 and a drain electrode 16 respectively contacted to the source region 12s and the drain region 12d (FIG. 6C).

Figure 7A:
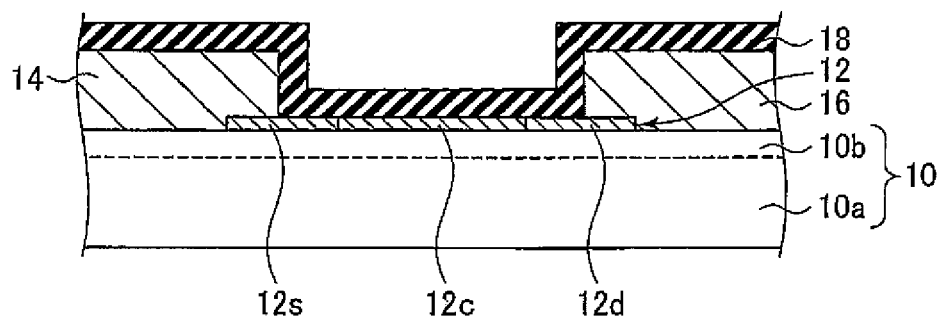
FIGS. 7A and 7B are sectional views of the semiconductor device according to the first embodiment in the steps of the second example of the method of manufacturing the semiconductor device (Part 3)

Then, on the entire surface, an insulation film is deposited by, e.g., ALD (Atomic Layer Deposition) (FIG. 7A). The insulation film 18 is, e.g., alumina ($Al_2O_3$) of an about 5 nm-thickness.

Next, on the entire surface, an Au/Ti film (not illustrated) is formed by, e.g., electron beam vapor deposition.

Figure 7B:
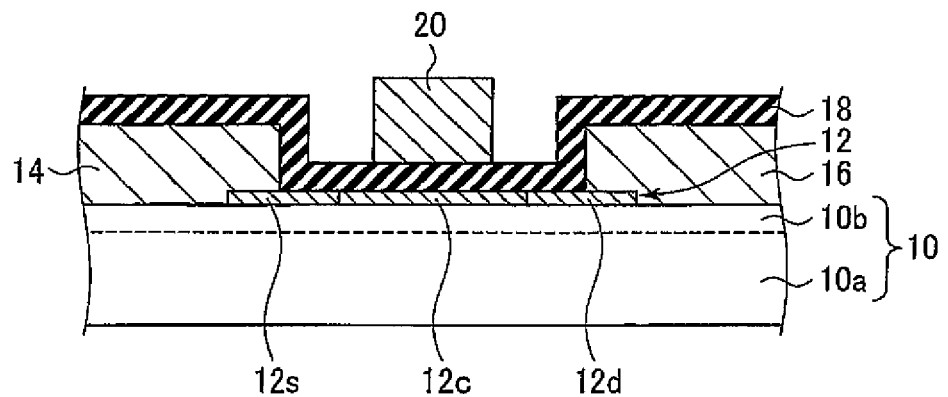

Then, the Au/Ti film is patterned by, e.g., photolithography to form a gate electrode 20 (FIG. 7B).

As described above, the thin film transistor using an MLG or an FLG in the channel is manufactured.

(Semiconductor Device Manufacturing Method (a third example))

A third example of the method of manufacturing the semiconductor device according to this embodiment will be described with reference to FIGS. 8A through 10C. The same members of the example as those of the first example illustrated in FIGS. 2A through 4B are represented by the same reference number, and their explanation will omitted or simplified.

In the first and the second examples, the intercalation of the graphene film and the removal of the catalyst metal film are made at the same time. In this example, the intercalation of the graphene film and the removal of the catalyst metal film are made in different steps.

Figure 8A:
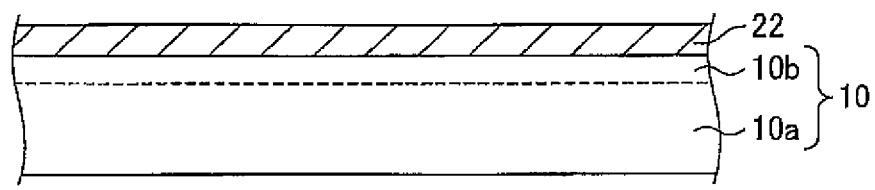
FIGS. 8A, 8B, and 8C are sectional views of the semiconductor device according to a third embodiment in the steps of a third example of the method of manufacturing the semiconductor device (Part 1)

First, a silicon substrate 10 with an oxide film is prepared (FIG. 8A).

Next, on the silicon substrate 10 with the oxide film, a catalyst metal film 22 formed of a metal as the catalyst for graphene is deposited (FIG. 8A). As the catalyst metal film 22, an iron film of, e.g., an about 500 nm-thickness is deposited on the silicon substrate 10 with the oxide film by sputtering, electron beam vapor deposition or others.

Figure 8B:
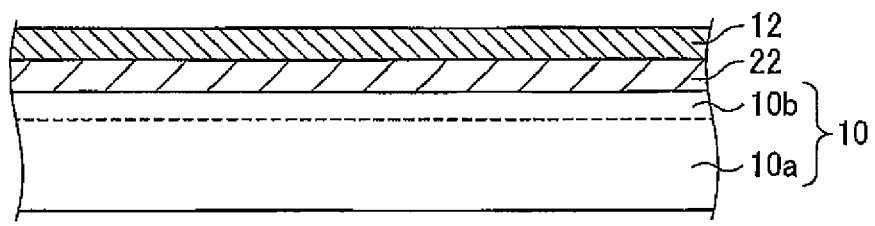

Then, on the catalyst metal film 22, a few layer graphene film 12 is synthesized (FIG. 8B). The few layer graphene film 12 is synthesized at 1000 C by, e.g., thermal CVD.

Next, after the few layer graphene film 12 has been synthesized, the sample is loaded in a nitrogen atmosphere to be sufficiently degassed under, e.g., $10^{-2}$ pascal or below $10^{-2}$ pascal for, 12 hours or more.

Figure 8C:
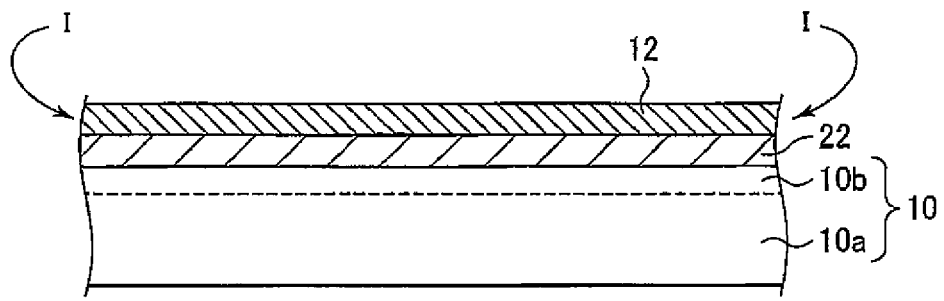

Then, the sample is loaded in an iodine content atmosphere using anhydrous iodine (I), under, e.g., $10^{-2}$ paacal for, e.g., 12-24 hours (FIG. 8C).

Figure 9A:
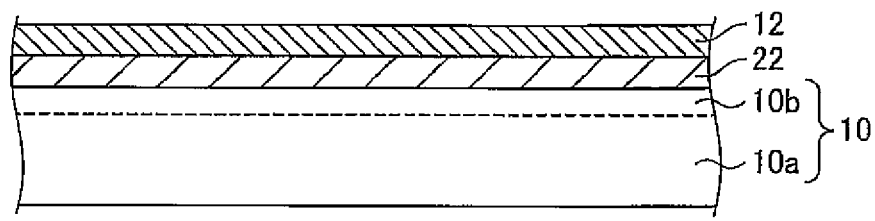
FIGS. 9A, 9B, and 9C are sectional views of the semiconductor device according to the third embodiment in the steps of the third example of the method of manufacturing the semiconductor device (Part 2)

Thus, the molecules of the iodine intrude into the film of the few layer graphene film 12, and intercalated and doped (FIG. 8C, FIG. 9A).

Figure 9B:
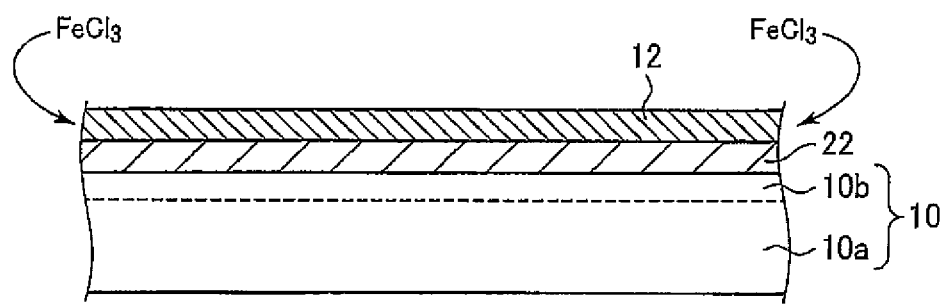

Next, the sample is loaded in an oxidation atmosphere of an oxidizer, e.g., an iron chloride content oxidation atmosphere using anhydrous iron chloride ($FeCl_3$) at, e.g., 310 C, e.g., for 6 to 24 hours (FIG. 9B).

Figure 9C:
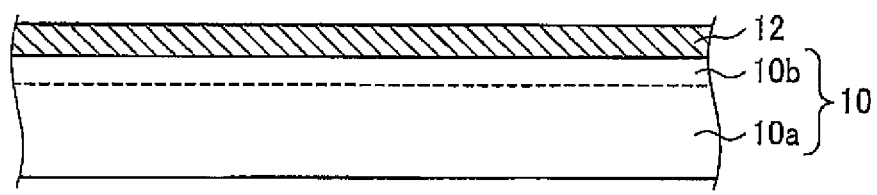

Thus, the catalyst metal film 22 is removed by the iron chloride, and the graphene film 12 is transferred to the silicon substrate 10 (FIG. 9C).

Figure 10A:
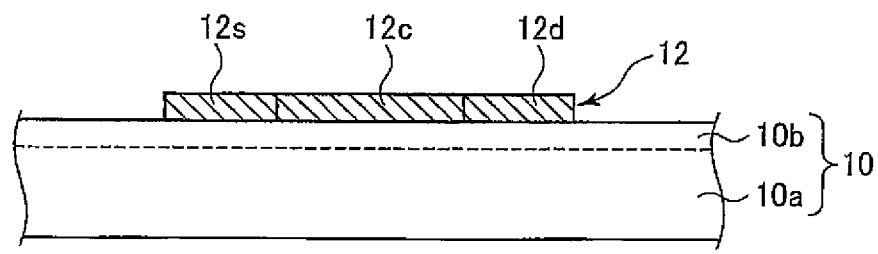
FIGS. 10A, 10B, and 10C are sectional views of the semiconductor device according to the third embodiment in the steps of the third example of the method of manufacturing the semiconductor device (Part 3)

Next, the graphene film 12 is patterned in the channel configuration of the TFT to be manufactured (FIG. 10A). The graphene film 12 is patterned by, e.g., photolithography or electron beam lithography.

The graphene film 12 is removed by oxygen plasma processing or heating processing to be patterned.

In advance of the oxygen plasma processing or the heating processing, excessive iron chloride and iron oxide excessively adhering to the graphene film 12 is removed by, e.g., pure water rinse or a rust removing agent?.

Next, an impurity is doped to form a source region 12s and a drain region 12d on both sides of the channel region 12c at the center (FIG. 10A).

Next, an Au/Ti film (not illustrated) is formed on the entire surface by, e.g., electron beam vapor deposition.

Figure 10B:
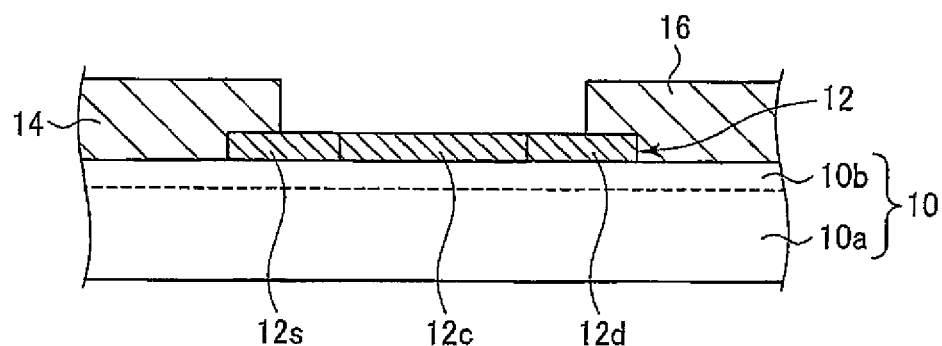

Next, the Au/Ti film is patterned by, e.g., photolithography to form a source electrode 14 and a drain electrode 16 respectively contacted to the source region 12a and the drain region 13d (FIG. 10B).

Figure 10C:
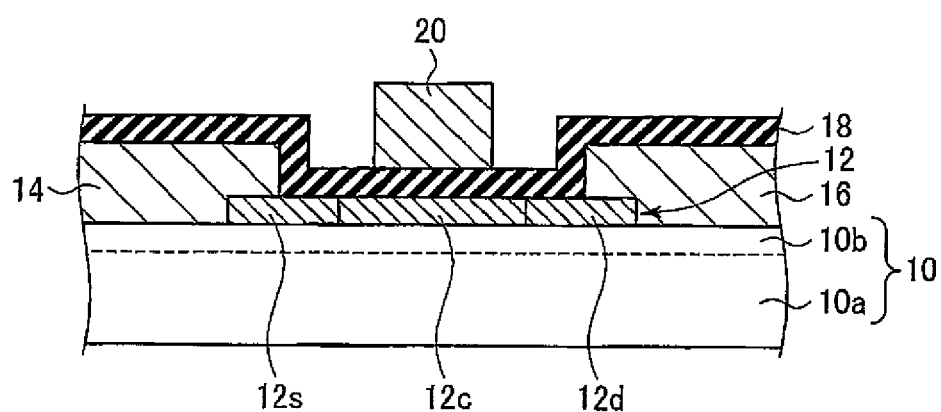

Next, an insulation film 18 is deposited (FIG. 10C). The insulation film 18 is, e.g., an about 6 nm-thickness alumina ($Al_2O_3$).

Next, on the entire surface, an Au/Ti film (not illustrated) is formed by, e.g., electron beam vapor deposition.

Next, the Au/Ti film is patterned by, e.g., photolithography to for a gate electrode 29 (FIG. 10C).

As described above, the intercalation of the graphene film and the removal of the catalyst film are made in the different steps, whereby the thin film transistor using the FLG in the channel is manufactured.

As described above, in this example, the intercalation of the graphene film and the removal of the catalyst metal are made in different steps, whereby the intercalation of the graphene film 12 and the removal of the catalyst metal film 22 can be made under respective most suitable conditions.

In this example, the intercalation of the graphene film is made in advance, and then the removal of the catalyst metal film is made. However, it is possible that the removal of the catalyst metal is made in advance, and then the intercalation of the graphene film is made.

Thin film transistors using the MLG or the FLG in the channel may be manufactured by making, in the same way, the intercalation of the graphene film and the removal of the catalyst metal film in different steps.

The graphene manufacturing method described above can manufacture a semiconductor device using graphene film in good condition without generating wrinkles and stresses, and the residues of the resin.

(b) Second Embodiment

Figure 11:
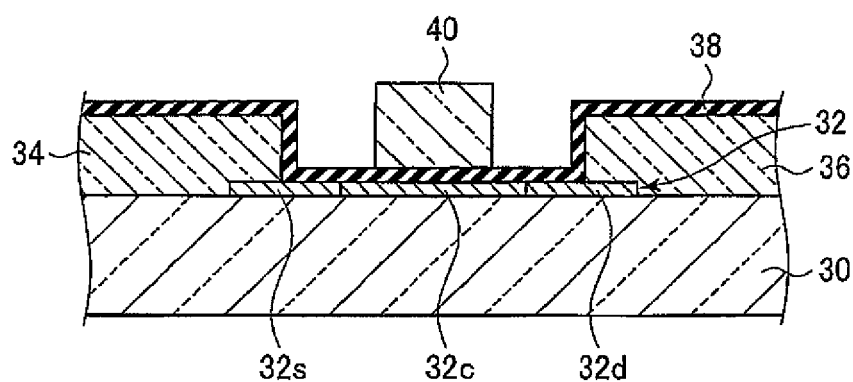
FIG. 11 is a view of the semiconductor device according to a second embodiment.

The semiconductor device according to a second embodiment and the method of manufacturing the semiconductor device will be described with reference to FIGS. 11 through 20B. FIG. 11 is a view of the semiconductor device according to the second embodiment, FIGS. 12A through 14B are sectional views of the semiconductor device according to the second embodiment in the steps of the method of manufacturing the semiconductor device of the first example. FIGS. 15A through 17B are sectional views of the semiconductor device according to the second embodiment in the steps of the method of manufacturing the semiconductor device of a second example. FIGS. 18A through 20B are sectional views of the semiconductor device according to the second embodiment in the steps of the method of manufacturing the semiconductor device of a third example. FIGS. 21A through 23C are sectional views of the semiconductor device according to the second embodiment in the steps of the method of manufacturing the semiconductor device of a fourth example.

(Semiconductor Device)

The semiconductor device according to this embodiment will be described with reference to FIG. 11.

The semiconductor device according to this embodiment is a transparent thin film transistor using graphene film in the channel.

A monolayer or a bi layer graphene film 32 is formed on a transparent substrate 30.

The transparent substrate 30 is, e.g., an about 300 m-thickness sapphire substrate or an about 300 m-thickness glass substrate.

The graphene film 32 is formed of MLG (monolayer graphene) or BLG (bilayer graphene). The thickness of the graphene film 32 is, e.g., 0.3-5.0 nm.

In the graphene film 32, a source region 32s and a drain region 32d are formed on both sides of the channel region 32c at the center.

The source region 32s and the drain region 32d are doped with nitrogen or others, which is an n-dopant, for the n-TFT and, for the p-TFT, with borane or others, which is a p-dopant.

On both sides of the graphene film 32, a source electrode 34 and a drain electrode which are transparent are formed respectively contacted to the source region 32s and the drain region 32d.

On the channel region 32c of the graphene film 32, a transparent gate electrode 40 is formed with a transparent gate insulation film 38 formed therebetween.

The transparent source electrode 34, the drain electrode 36 and the gate electrode 40 are formed of, e.g., an about 20 nm-thickness ITO (Indium Tin Oxide).

The transparent gate insulation film 38 is formed of, e.g., an about 5 nm-thickness silica.

A CMOS thin film transistor device (not illustrated) can be formed of the p-TFT and the n-TFT illustrated in FIG. 11.

(Method of Manufacturing the Semiconductor Device (a first example))

A first example of the method of manufacturing the semiconductor device according to this embodiment will be described with reference to FIGS. 12A through 14B.

The semiconductor device manufactured by this example is a transparent thin film transistor using monolayer graphene film in the channel.

Figure 12A:
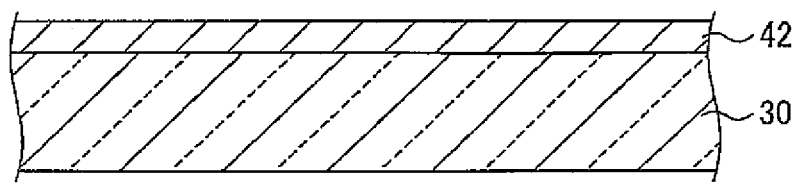
FIGS. 12A, 12B, and 12C are sectional views of the semiconductor device according to the second embodiment in the steps of a first example of the method of manufacturing the semiconductor device (Part 1)

First, a transparent substrate 30 is prepared (FIG. 12A). The transparent substrate 30 is, e.g., an about 300 m-thickness sapphire substrate.

Next, on the transparent substrate 30, a catalyst metal film 42 formed of a metal which is the catalyst for graphene is deposited (FIG. 12A). As the catalyst metal film 22, an about 1000 nm-thickness copper film, for example, is deposited on the transparent substrate 30 by sputtering, electron beam vapor deposition or others.

Figure 12B:
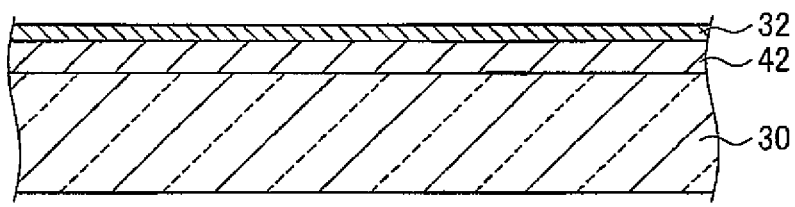

Next, a monolayer graphene film 32 is synthesized on the catalyst metal film 42 (FIG. 12B).

The monolayer graphene film 32 is synthesized, e.g., by thermal CVD at 1000 C. In the thermal CVD, for example, methane gas is used as the raw material, and as the dilution gas, hydrogen and argon are used. The flow rate of the argon gas is, e.g., 4000 sccm, the flow rate of the hydrogen id, e.g., 100 sccm, and the flow rate of the methane gas is, e.g., 1 sccm. The total pressure is, e.g., 500 mbar.

Next, after the monolayer graphene film 32 has been synthesized, the sample is loaded in a nitrogen atmosphere and sufficiently degassed under a pressure of, e.g., below $10^{-2}$ pascal including $10^{-2}$ pascal for, e.g., 12 hours or more.

Figure 12C:
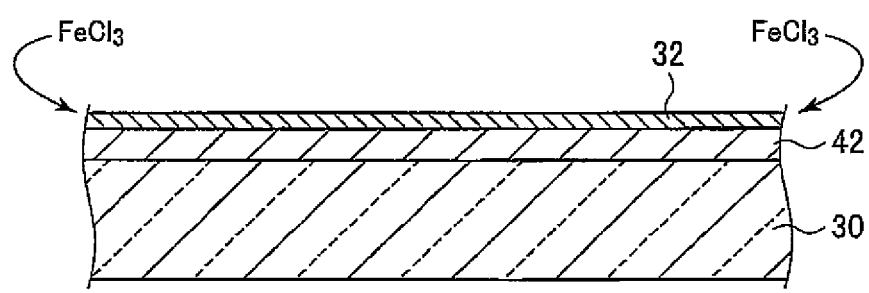

Then, the example is loaded in an oxidation atmosphere of an oxidant, e.g., an iron chloride content oxidation atmosphere using anhydrous iron chloride ($FeCl_3$) at, e.g., 310 C for, e.g., 6 to 24 hours (FIG. 12C).

Figure 13A:
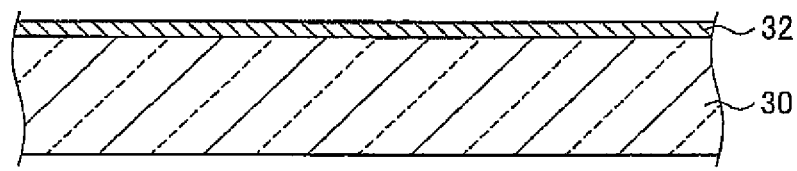
FIGS. 13A, 13B, and 13C are sectional views of the semiconductor device according to the second embodiment in the steps of the first example of the method of manufacturing the semiconductor device (Part 2)

Thus, the catalyst metal film 42 is removed by the iron chloride, and the graphene film 32 is transferred to the transparent substrate 30 (FIG. 13A). The intercalation does not take place in the graphene film 32, which is a monolayer.

Figure 13B:
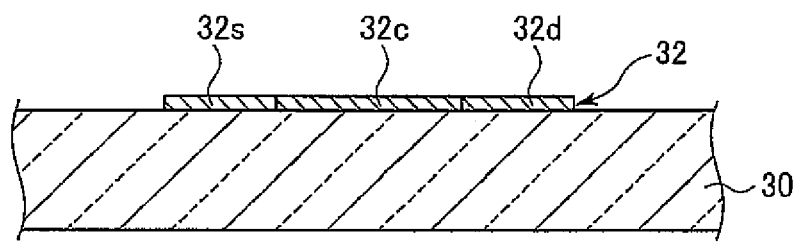

Then, the graphene film 32 is patterned in the channel configuration of the TFT to be manufactured (FIG. 13B). The graphene film 32 is patterned by, e.g., photolithography or electron beam lithography. As the patterning configuration of the graphene film 32, for the channel, the channel width can be within, e.g., the range of 0.5-3000 nm and preferably within the range of 3.0-20 nm.

Next, an impurity is doped to form the source region 32s and the drain region 32d on both sides of the channel region 32c at the center (FIG. 13B).

For the n-TFT, nitrogen or others, which is an n-dopant, is doped to form the n-source region 32s and the n-drain region 32d. For the o-TFT, boron or others, which is an p-dopant, is doped to form the p-source region 32s and the p-drain region 32d.

Next, on the entire surface, an ITO (Indium Tin Oxide) film (not illustrated) is formed by, e.g., sputtering.

Figure 13C:
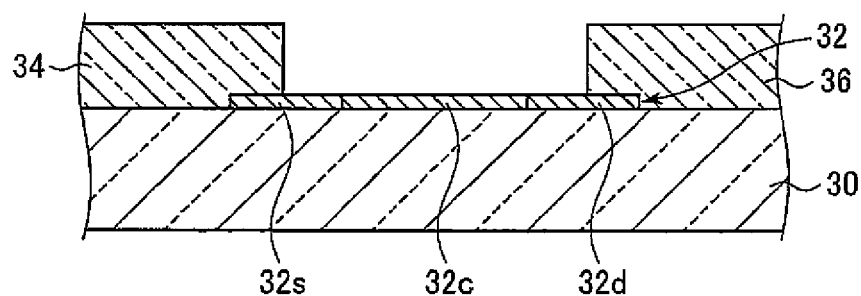

Then, the ITO film is patterned by, e.g., photolithography to form the source electrode 34 and the drain electrode 36, which are transparent, respectively contacted to the source region 32s and the drain region 32d (FIG. 13C).

Figure 14A:
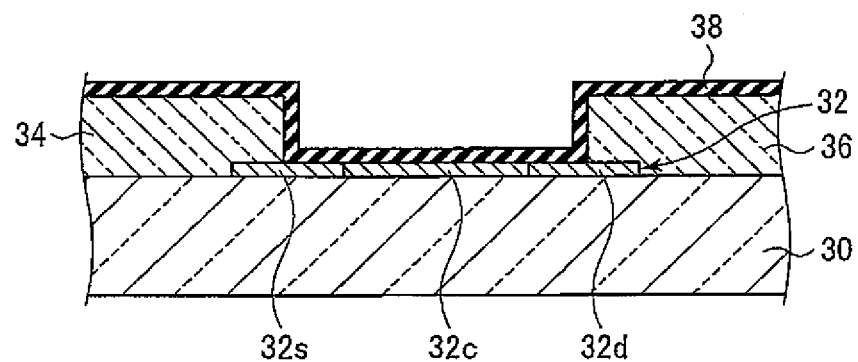
FIGS. 14A and 14B are sectional views of the semiconductor device according to the second embodiment in the steps of the first example of the method of manufacturing the semiconductor device (Part 3)

Next, on the entire surface, the transparent insulation film 38 is applied by, e.g., spin coating or others (FIG. 14A). The insulation film 38 is, e.g., an about 5 nm-thickness silica (silicon dioxide).

Next, on the entire surface, an ITO (Indium Tin Oxide) film (not illustrated) is formed by, e.g., sputtering.

Figure 14B:
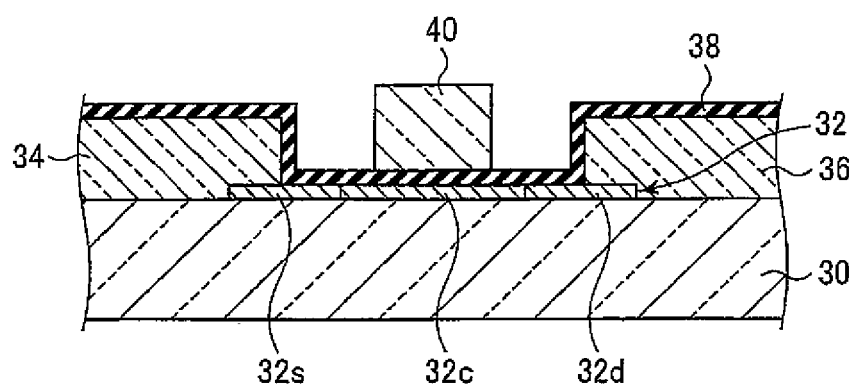

Then, the ITO film is patterned by, e.g., photolithography to form the gate electrode 40 (FIG. 14B).

As described above, the transparent thin film transistor using a monolayer graphene film in the channel is manufactured.

(Method of Manufacturing the Semiconductor Device (a second example))

The second example of the method of manufacturing the semiconductor device according to the present embodiment will be described with reference to FIGS. 15A through 17B.

The semiconductor device according to the present embodiment is a thin film transistor using bi-layer graphene film in the channel.

Figure 15A:
FIGS. 15A, 15B, and 15C are sectional views of the semiconductor device according to the second embodiment in the steps of a second example of the method of manufacturing the semiconductor device (Part 1)

First, a metal foil 44 is prepared (FIG. 15A). The foil 44 is copper foil of, e.g., an about 25 m-thickness and an about 99.99 purity.

Figure 15B:
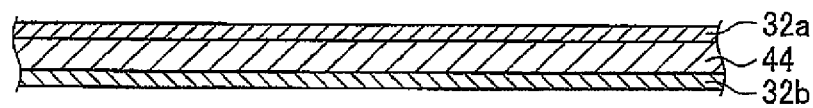

Next, monolayer graphene films 32a, 32b are synthesized respectively on both surfaces of the metal foil 44 (FIG. 15B).

The monolayer graphene films 32a, 32b are synthesized by, e.g., thermal CVD at 1000 C. In the thermal CVD, for example, methane gas is used as the raw material, and as the dilution gas, hydrogen and argon are used. The flow rate of the argon gas is, e.g., 1000 sccm, and flow rate of the hydrogen is, e.g., 100 sccm. The flow rate of the methane gas is, e.g., 0.5 sccm.

Figure 15C:
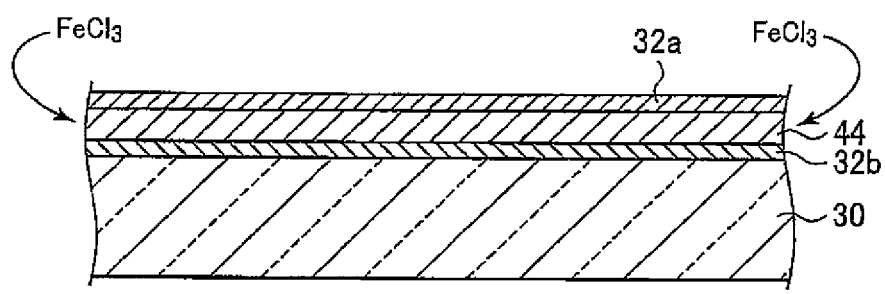

Next, as the monolayer graphene films 42a, 32b have been synthesized, the sample is loaded on the transparent substrate 30 to be sufficiently degassed under a pressure of, e.g., $10^{-2}$ pascal or more and for, e.g., 12 hours or more (FIG. 15C).

Then, the sample is loaded in an oxidation atmosphere of an oxidizer, e.g., an iron chloride content oxidation atmosphere using, anhydrous iron chloride ($FeCl_3$), at, e.g., 310 C, for, e.g., 6 0 24 hours (FIG. 15C).

Figure 16A:
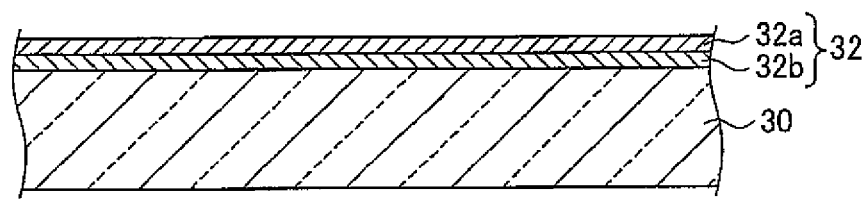
FIGS. 16A, 16B, and 16C are sectional views of the semiconductor device according to the second embodiment in the steps of the second example of the method of manufacturing the semiconductor device (Part 2)

Thus, the metal foil 44 is removed by the iron chloride, and the bi-layer graphene film 32 formed of the monolayer graphene films 32a, 32b is transferred to the transparent substrate 30 (FIG. 16A).

At this time, the iron chloride is often intercalated, and if necessary, the sample is held in a vacuum at about 500 C to be removed the intercalated iron chloride.

Figure 16B:
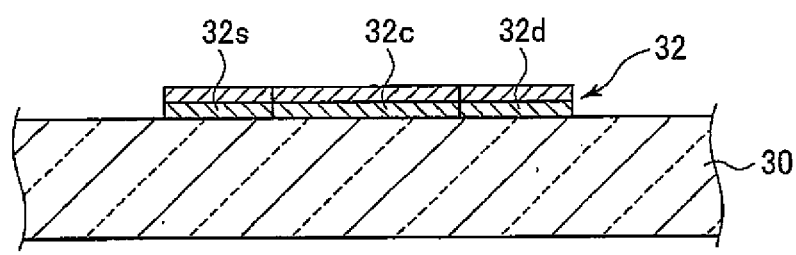

Then, the graphene film 32 is patterned in the configuration of the TFT to be manufactured (FIG. 16B). The graphene film 32 is patterned by, e.g., photolithography or electron beam lithography.

Next, an impurity is doped to form the source region 32a and the drain region 32d (FIG. 16B).

For the n-TFT, nitrogen or others, which is an n-dopant, is doped to form the n-source region 32a and the n-drain region 32d. For the n-TFT, boron or others, which is a p-dopant, is doped to form the p-source region 32a and the p-drain region 32d.

Next, on the entire surface, an ITO (Indium Tin Oxide) film (not illustrated) is formed by, e.g., sputtering.

Figure 16C:
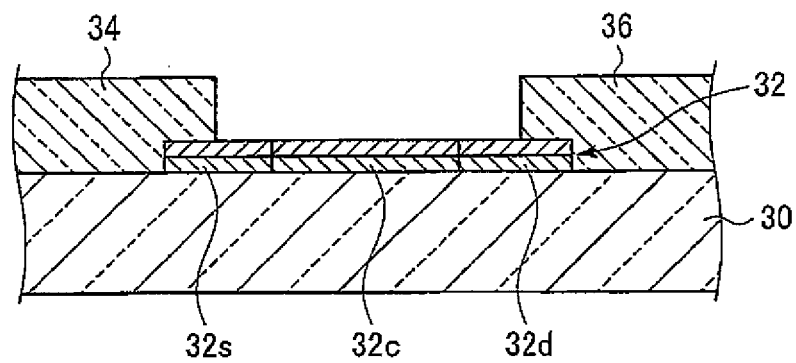

Next, the ITO film is patterned by, e.g., photolithography to form the source electrode 34 and the drain electrode 36, which are transparent, respectively contacted to the source region 32a and the drain region 32d (FIG. 16C).

Figure 17A:
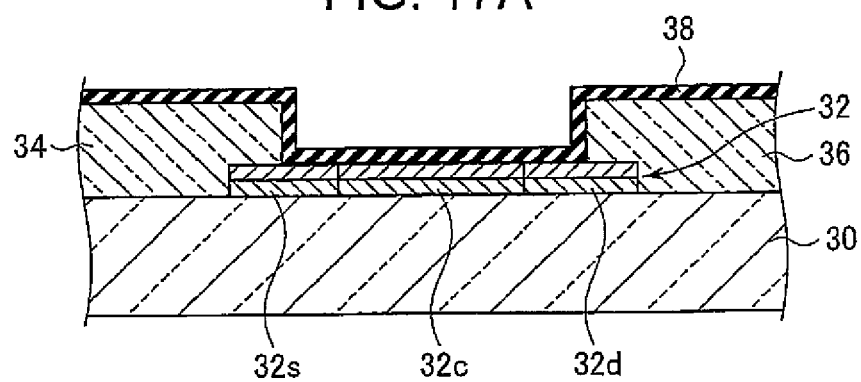
FIGS. 17A and 17B are sectional views of the semiconductor device according to the second embodiment in the steps of the second example of the method of manufacturing the semiconductor device (Part 3)

Next, on the entire surface, the transparent insulation film 38 is formed by, coating, e.g., spin coating or others (FIG. 17A). The insulation film 38 is, e.g., an about 5 nm-thickness silica (silicon dioxide).

Next, on the entire surface, an ITO (Indium Tin Oxide) film (not illustrated) is formed by coating, e.g., spin coating or others.

Figure 17B:
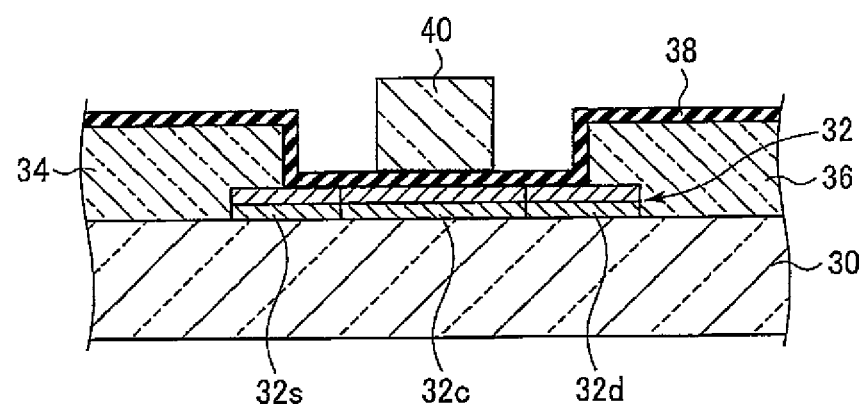

Next, the ITO film is patterned by, e.g., photolithography to form the gate electrode 40 (FIG. 17B).

As described above, the transparent thin film transistor using the bi-layer graphene film in the channel is manufactured.

(Method of Manufacturing the Semiconductor Device (a third example))

A third example of the method of manufacturing the semiconductor device according to this embodiment will be described with reference to FIGS. 18A through 20B.

The semiconductor device to be manufactured in this example is a transparent thin film transistor using a monolayer graphene film in the channel.

Figure 18A:
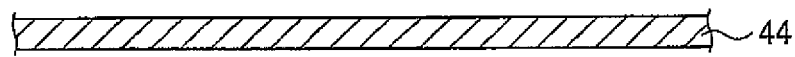
FIGS. 18A, 18B, and 18C are sectional views of the semiconductor device according to the second embodiment in the steps of a third example of the method of manufacturing the semiconductor device (Part 1)

First, metal foil 44 is prepared (FIG. 18A). The metal foil 44 is, e.g., copper foil of an about 25 m-thickness and an bout 99.99 purity.

Figure 18B:

Next, monolayer graphene film (not illustrated) is synthesized on both surfaces of the metal foil 44, and then the graphene film (not illustrated) formed on one surface is removed to leave the monolayer graphene film 32 on the other surface of the metal foil 44 (FIG. 18B).

To remove the graphene film formed on one surface, after the graphene film formed on the other surface has been covered with a protection film, such as a resist or others, the graphene film on said one surface is removed by asking, RIE using oxygen plasma or others or heating in an oxygen atmosphere containing the atmospheric. Then, the protection film, such as a resist or others, is removed.

Figure 18C:
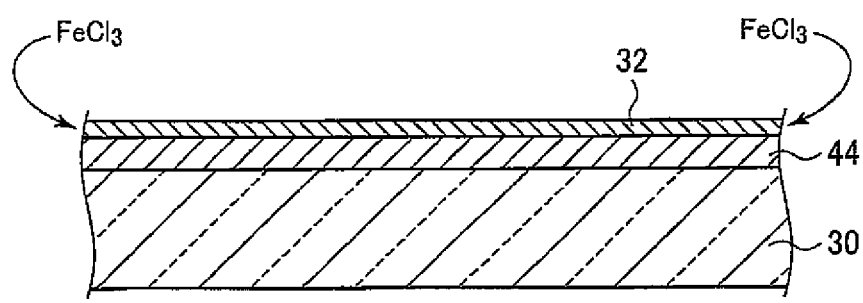

Next, after the monolayer graphene film 32 has been synthesized, the sample is loaded on the transparent substrate 30 to be sufficiently degassed under a pressure of $10^{-2}$ pascal or below for, e.g., 12 hours or more (FIG. 18C).

Then, the sample is loaded in an oxidation atmosphere of an oxidizer, e.g., an iron chloride content oxidation atmosphere containing anhydrous iron chloride ($FeCl_3$) at, e.g., 310 C or, e.g., 6-24 hours (FIG. 18C).

Figure 19A:
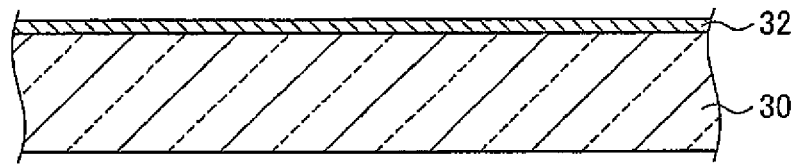
FIGS. 19A, 19B, and 19C are sectional views of the semiconductor device according to the second embodiment in the steps of the third example of the method of manufacturing the semiconductor device (Part 2)

Thus, the metal foil 44 is removed by the iron chloride, and the monolayer graphene film 32 is transferred to the transparent substrate 30 (FIG. 19A).

Figure 19B:
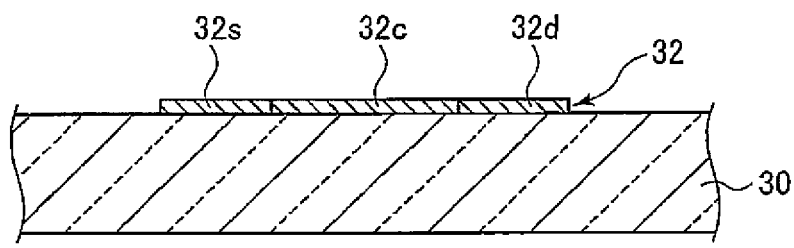

Then, the graphene film 32 is patterned in the configuration of the channel of the TFT to be manufactured (FIG. 19B). The graphene film 32 is patterned by, e.g., photolithography or electron beam lithography.

Next, an impurity is doped to form the source region 32s and the drain region 32d on both sides of the channel region 32c at the center (FIG. 19B).

For the n-TFT, nitrogen or others, which is an n-dopant, is doped to form the n-source region 32a and the n-drain region 32d. For the p-TFT, boron or others, which is a p-dopant, is doped to form the p-source region 32a and the p-drain region 32d.

Next, on the entire surface, an ITO (Indium Tin Oxide) film (not illustrated) is formed by, e.g., sputtering.

Figure 19C:
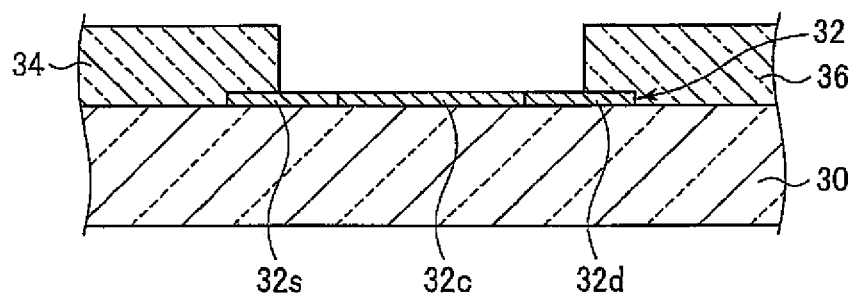

Then, the ITO film is patterned by, e.g., photolithography to form the transparent source electrode and the transparent drain electrode 36 respectively contacted to the source region 32s and the drain region 32d (FIG. 19C).

Figure 20A:
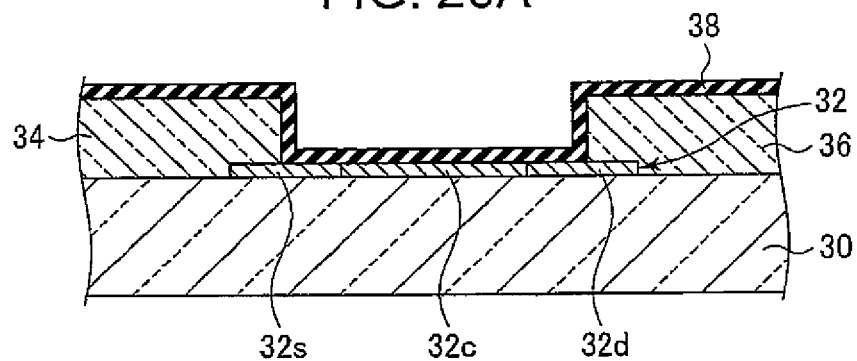
FIGS. 20A and 20B are sectional views of the semiconductor device according to the second embodiment in the steps of the third example of the method of manufacturing the semiconductor device (Part 3)

Next, on the entire surface, the transparent insulation film 38 is formed by the coating, e.g., spin coating or others (FIG. 20A). The insulation film 38 is, e.g., an about 5 nm-thickness silica (silicon dioxide).

Then, on the entire surface an ITO Indium Tin Oxide) film (not illustrated) is formed by, e., sputtering.

Figure 20B:
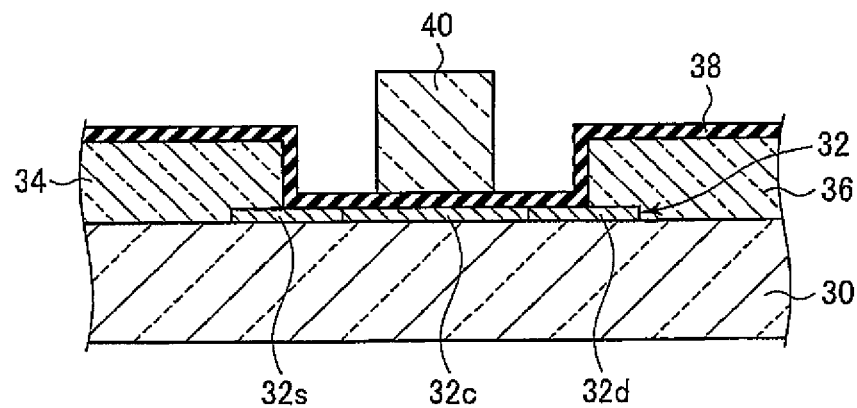

Next, the ITO film is FIG. 20B).

As described above, the transparent thin film transistor using monolayer graphene film in the channel is manufactured.

(Method of Manufacturing the Semiconductor Device (a fourth example))

A fourth example of the method of manufacturing the semiconductor device according to this embodiment will be described with reference to FIGS. 21A through 23C.

The semiconductor device to be manufactured by this example is a transparent thin film transistor using graphene film in the channel manufactured by forming graphene film on a silicon substrate with oxide film and then transferring the graphene film to the transparent substrate.

Figure 21A:
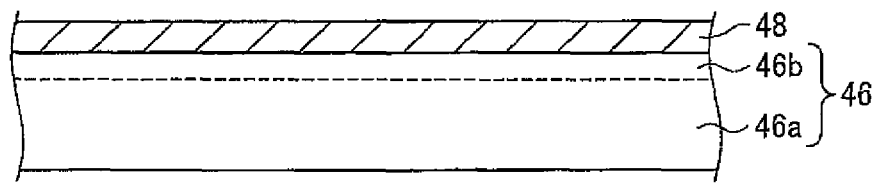
FIGS. 21A, 21B, and 21C are sectional views of the semiconductor device according to the second embodiment in the steps of a fourth example of the method of manufacturing the semiconductor device (Part 1)

First, a silicon substrate 46 with oxide film is prepared (FIG. 21A). The silicon substrate 46 with oxide film has, e.g., an about 90 nm-thickness silicon oxide film 46b formed on an about 300 m-thickness silicon substrate 46a.

Next, on the silicon substrate 46 with the oxide film, a catalyst metal film 48 formed on a metal to be the catalyst for the graphene is deposited (FIG. 21A). As the catalyst metal film 48, for example, an about 500 nm-thickness cobalt film is deposited on the silicon substrate 46 with the oxide film by sputtering, electron beam vapor deposition or others.

Figure 21B:
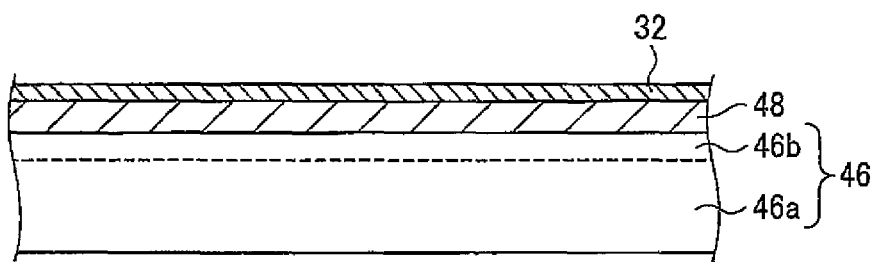

Next, a multi-layer graphene film 32 is synthesized on the catalyst metal film 48 (FIG. 21B). The multi-layer graphene film 32 is synthesized by, e.g., thermal CVD at 1000 C.

Next, after the multi-layer graphene film 32 has been synthesized, the sample is loaded in a nitrogen atmosphere and is sufficiently degassed under a pressure of $10^{-2}$ pascal or below for, e.g., 12 hours or more.

Figure 21C:
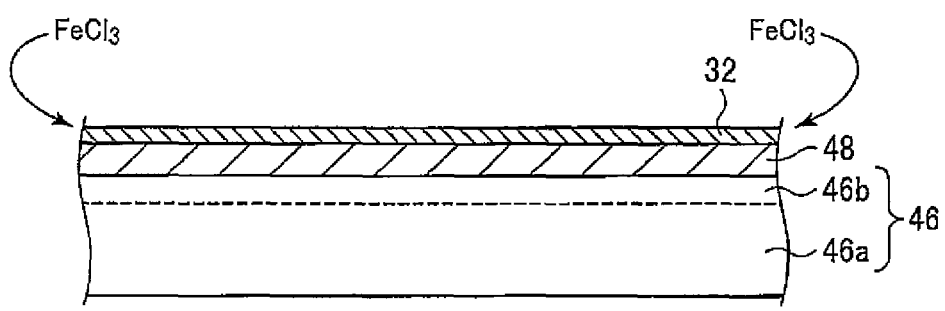

Then, the sample is loaded in an oxidation atmosphere of an oxidizer, e.g., an iron chloride content oxidation atmosphere using anhydrous iron chloride ($FeCl_3$) at, e.g., 310 C for, e.g., 12-24 hours (FIG. 21C).

Figure 22A:
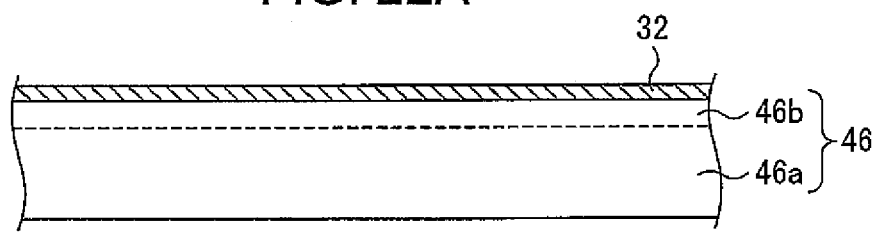
FIGS. 22A, 22B, and 22C are sectional views of the semiconductor device according to the second embodiment in the steps of the fourth example of the method of manufacturing the semiconductor device (Part 2)

Thus, the catalyst metal film 48 is removed by the iron chloride, the graphene film 32 is transferred to the silicon substrate 46 while the molecules of the iron chloride intrude into the multi-layer graphene film 32 and intercalated, and doped (FIG. 21C, FIG. 22A).

Figure 22B:
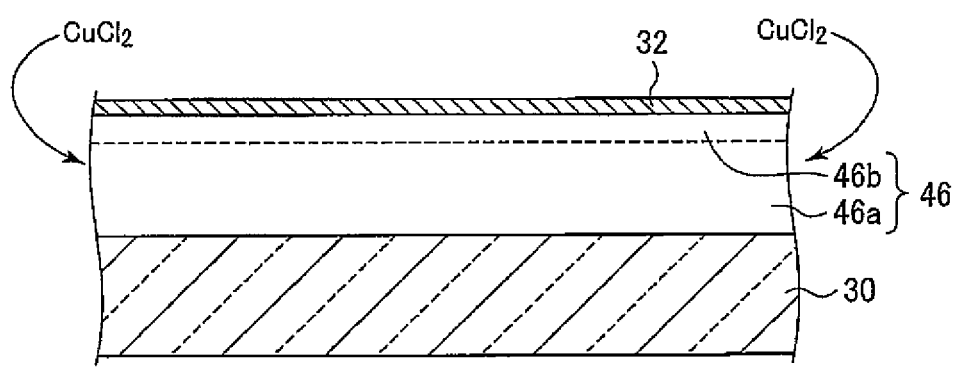

Next, on a transparent substrate 30, the silicon substrate 46 with the graphene film 32 formed on is mounted (FIG. 22B).

Then, the sample is loaded in an oxidation atmosphere of an oxidizer, e.g., an copper chloride content oxidation atmosphere using an anhydrous copper chloride (CuCl3) at, e.g., 85 C for, e.g., 6-24 hours (FIG. 22B).

Figure 22C:
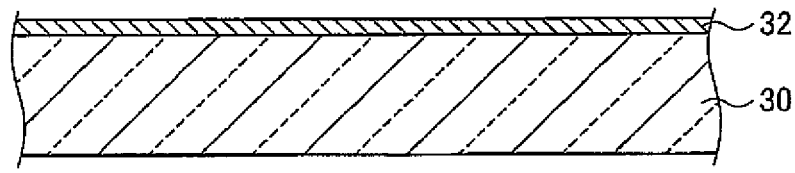

Thus, the silicon substrate 46 is removed by the copper chloride, and the graphene film 32 is transferred to the transparent substrate 30 (FIG. 33B, FIG. 22C). AT this time, when the intercalated iron chloride and copper chloride are unnecessary, the sample is held in a vacuum at about 500 C, whereby the intercalated iron chloride is removed.

Figure 23A:
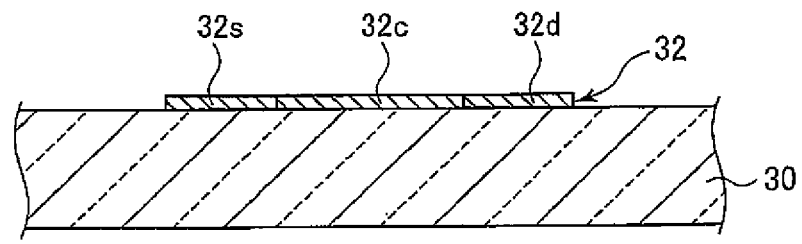
FIGS. 23A, 23B, and 23C are sectional views of the semiconductor device according to the second embodiment in the steps of the fourth example of the method of manufacturing the semiconductor device (Part 3)

Next, the graphene film 32 is patterned in the channel configuration of the TFT to be manufactured (FIG. 23A). The patterning of the graphene film 32 is made by, e.g., photolithography or electron beam lithography.

Then, an impurity is doped to form the source region 32s and the drain region 32d on both sides of the channel region 32c at the center (FIG. 23A).

For the n-TFT, nitrogen or others, which is an n-dopant, is doped to form the n-source region 32s and the n-source drain region 32d. For the p-TFT, boron or others, which is a p-dopant, is doped to form the p-source region 32s and the p-drain region 32d.

Then, on the entire surface, an ITO (Indium Tin Oxide) film (not illustrated) is formed by, e.g., sputtering.

Figure 23B:
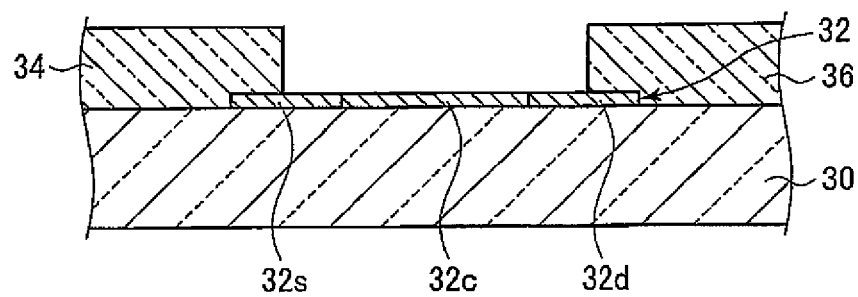

Next, the ITO film is patterned by, e.g., photolithography to form the transparent source electrode and the transparent drain electrode 36 respectively contacted to the source region 32a and the drain region 32d (FIG. 23B).

Next, on the entire surface a transparent insulation film 38 is coated by, e.g., spin coating or others (FIG. 23A). The insulation film 38 is, e.g., an about ~nm-thickness silica (silicon dioxide).

Then, on the entire surface, an ITO (Indium Tin Oxide) film (not illustrated) is formed by, e.g., sputtering.

Figure 23C:
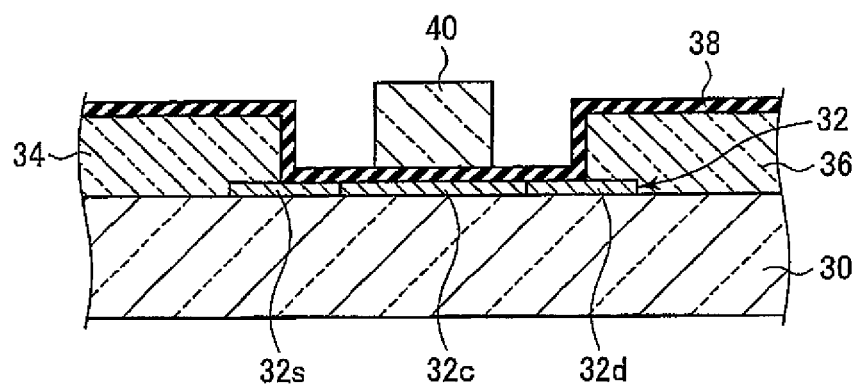

Next, the ITO film is patterned by, e.g., photolithography to form the gate electrode 40 (FIG. 23C).

As described above, the transparent thin film transistor using the multi-layer graphene film in the channel is manufactured.

The graphene manufacturing method described above can manufacture a semiconductor device using graphene film in good condition without generating wrinkles and stresses, and the residues of the resin.

(c) Third Embodiment

Figure 24:
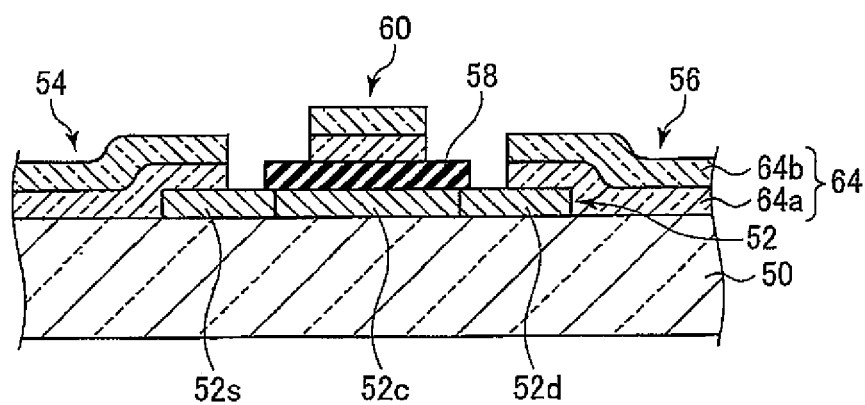
FIG. 24 is a view of the semiconductor device according to a third embodiment.

The semiconductor device according to a third embodiment and the method of manufacturing the semiconductor device will be described with reference to FIGS. 24 through 26B. FIG. 24 is a view of the semiconductor device according to the third embodiment, and FIGS. 25A through 26B are sectional views of the semiconductor device according to the third embodiment in the steps of the method of manufacturing the semiconductor device, which illustrate the manufacturing method.

(Semiconductor Device)

The semiconductor device according to this embodiment will be described.

The semiconductor device according to this embodiment is a transparent thin film transistor using graphene film in the electrodes and interconnects.

A transparent semiconductor film 52 is formed on a transparent substrate 50. The transparent substrate 50 is, .g., an about 300 m-thickness glass substrate. The transparent semiconductor film 52 is an oxide semiconductor of, e.g., an about 50 nm-thickness zinc oxide (ZnO) or others.

In the semiconductor film 52, a source region 52s and a drain region 52d are formed on both sides of a channel region 52c at the center.

The source region 52s and the drain region 52d are doped with nitrogen or others, which is an n-dopant, for the n-TFT, and for the p-TFT, borane or others, which is a p-dopant, is doped.

On the semiconductor film 52, a transparent insulation film 58 is formed. The transparent insulation film 58 is, e.g., an about 5 nm-thickness silica (silicon dioxide).

On both sides of the semiconductor film 52, a transparent source electrode 54 and a transparent drain electrode 56 are formed respectively contacted to the source region 52s and the drain region 52d.

On the channel region 52c of the semiconductor film 52, a transparent gate electrode 60 is formed with the transparent insulation film 58 formed therebetween.

The transparent source electrode 54, the drain electrode 56 and the gate electrode 60 are formed of multi-layer graphene film. The source electrode 54, the drain electrode 56 and the gate electrode 60 are respectively connected to electrodes (not illustrated).

The p-TFT and the n-TFT of the structure illustrated in FIG. 24 can form a thin film semiconductor device (not illustrated) of the CMOS structure.

(Method of Manufacturing the Semiconductor Device)

The method of manufacturing the semiconductor device according to this embodiment will be described with reference to FIGS. 25A through 26B.

Figure 25A:
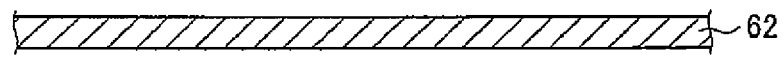
FIGS. 25A, 25B, and 25C are sectional views of the semiconductor device according to the third embodiment in the steps of the method of manufacturing the semiconductor device (Part 1)

First, a metal foil 62 is prepared (FIG. 25A). The metal foil 62 is, e.g., an about 1 m-thickness nickel fil of an about a purity of 99%.

Figure 25B:
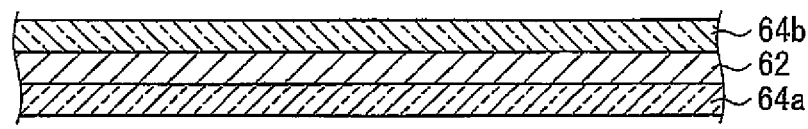

Next, on both surfaces of the metal foil 62, multi-layer graphene films 64a, 64b are synthesized (FIG. 25B).

The multi-layer graphene films 64a, 64b are synthesized on both surfaces of the metal foil 62 by, e.g., thermal CVD at 1000 C. In the thermal CVD, for example, methane gas is used as the raw material, and as the dilution gas, hydrogen and argon are used. The flow rate of the argon gas is, e.g., 4000 sccm, and the flow rate of the hydrogen is, e.g., 500 sccm, and the flow rate of the methane gas is, e.g., 50 sccm.

Figure 25C:
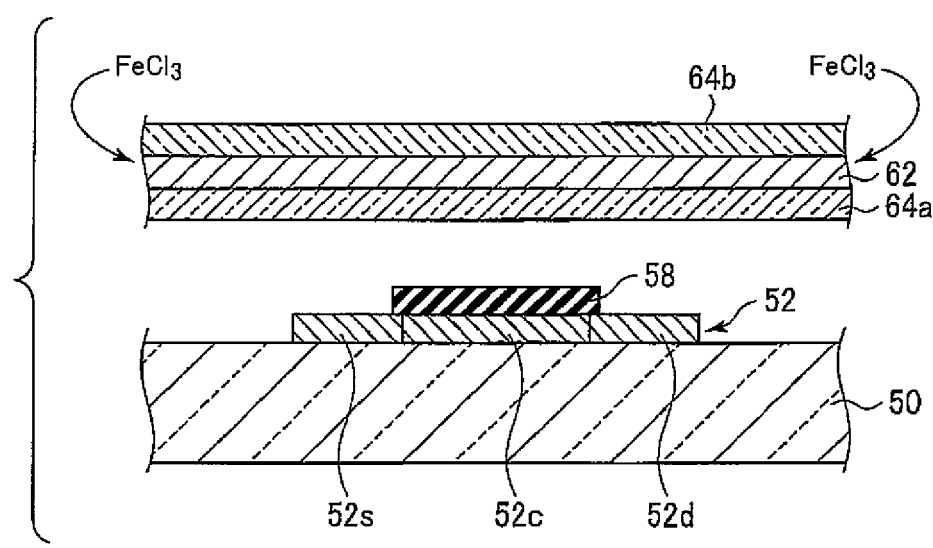

Next, on the transparent substrate 50 with the transparent semiconductor film 52 and the transparent insulation film 58, which has been separately prepared, the multi-layer graphene films 64a, 64b formed on both surfaces of the metal foil 62 are mounted and are sufficiently degassed under, e.g., a pressure of $10^{-2}$ pascal or below for, e.g., 12 hours or more (FIG. 25C).

Then, the sample is loaded in an oxidation atmosphere of an oxidized, e.g., an iron chloride content oxidation atmosphere using anhydrous iron chloride ($FeCl_3$) at, e.g., 310 C for, e.g., 6-24 hours (FIG. 25C).

Figure 26A:
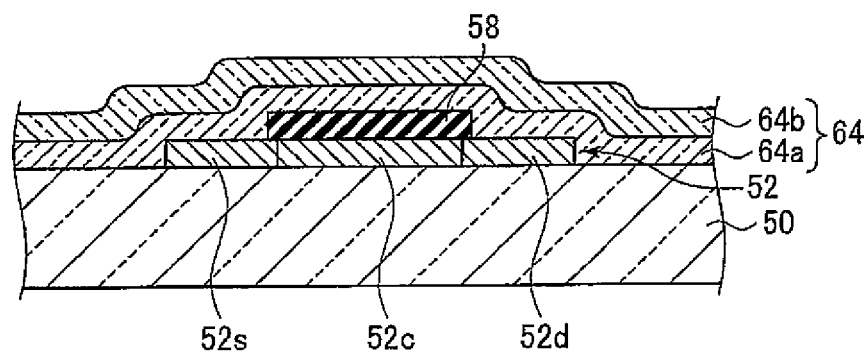
FIGS. 26A and 26B are sectional views of the semiconductor device according to the third embodiment in the steps of the method of manufacturing the semiconductor device (Part 2)
Figure 26B:
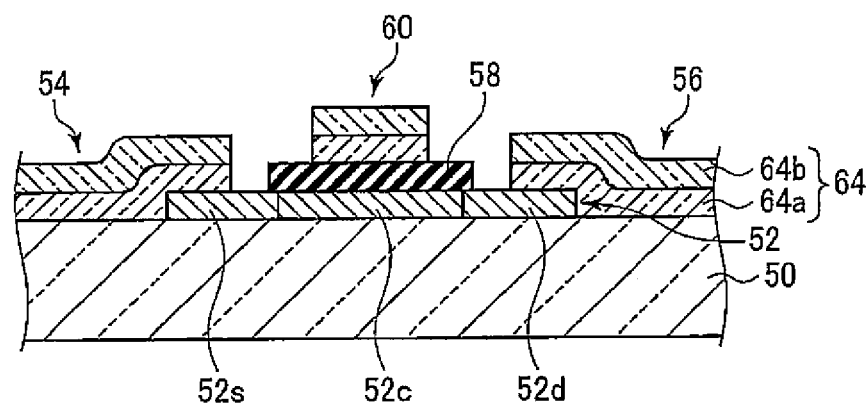

Thus, the metal foil 62 removed by the iron chloride, and the graphene film 64 of the multi-layer graphene films 64a, 64b is transferred to the transparent substrate 30 while the molecules of the iron chloride are intercalated in the films of the multilayer graphene films 64a, 64b (FIG. 26A).

Next, the multi-layer graphene films 64a, 64b are patterned to form the source electrode 54, the drain electrode 56 and the gate electrode 60.

The graphene manufacturing method described above can manufacture a semiconductor device using graphene film in good condition without generating wrinkles and stresses, and the residues of the resin.

(d) Fourth Embodiment

Figure 27:
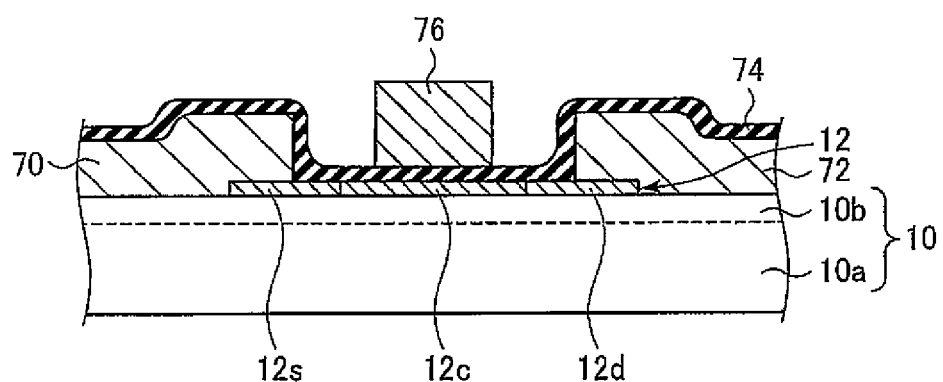
FIG. 27 is a view of the semiconductor device according to a fourth embodiment.

The semiconductor device according to a fourth embodiment and the method of manufacturing the semiconductor device will be described with reference to FIG. 27 through 29C. FIG. 27 is a view of the semiconductor device according to the fourth embodiment, and FIGS. 28A through 29C are sectional views of the semiconductor device according to the fourth embodiment in the steps of the method of manufacturing the semiconductor device, which illustrate the method of manufacturing the semiconductor device.

(Semiconductor Device)

The semiconductor device according to this embodiment will be described with reference to FIG. 27.

The semiconductor device according to the present embodiment is a thin film transistor (TFT) using monolayer graphene film or few layer graphene film in the channel and multi-layer graphene film in the interconnects of the source electrode, the drain electrode, etc.

A graphene film 12 is formed on a silicon substrate 10 with an oxide film.

The silicon substrate 10 with an oxide film is, e.g., an about 380 m-thickness silicon substrate 10a with an about 90 nm-thickness silicon oxide film 10b formed on.

The graphene film 12 is formed of an MLG or an FLG. The film thickness of the graphene film 12 is, e.g., 0.3-5.0 nm.

In the graphene film 12, a source region 12s and a drain region 12d are formed on both sides of the channel region 12c at the center.

The source region 12s and the drain region 12d are doped with nitrogen or others, which is an n-dopant, for the n-TFT and doped with boron or others, which is a p-dopant, for the p-TFT.

A source electrode 70 and a drain electrode 72 are formed on both sides of the graphene film 12, respectively contacted to the source region 12s and the drain region 12d.

The source electrode 70 and the drain electrode are formed of multi-layer graphene film. The film thickness of the source electrode 70 and the drain electrode 72 formed of multi-layer graphene film is, e.g., 0.9-50 nm.

On the channel region 12c of the graphene film 12, a gate electrode 76 is formed with a gate insulation film 74 formed therebetween.

The gate insulation film 74 is, e.g., an about 5 nm-thickness alumina ($Al_2O_3$) film deposited by LD (Atomic Layer Deposition).

The gate electrode 76 is formed of an Au/Ti film of an about 20 nm-thickness gold film deposited on an about 5 nm-thickness titanium film.

The gate electrode 76 may be formed of FLG as well as the source electrode 70 and drain electrode 72.

The p-TFT and the n-TFT can form the semiconductor device (not illustrated) of CMOS structure.

(Method of Manufacturing the Semiconductor Device)

The method of manufacturing the semiconductor device will be described with reference to FIGS. 28 and 29.

Figure 28A:
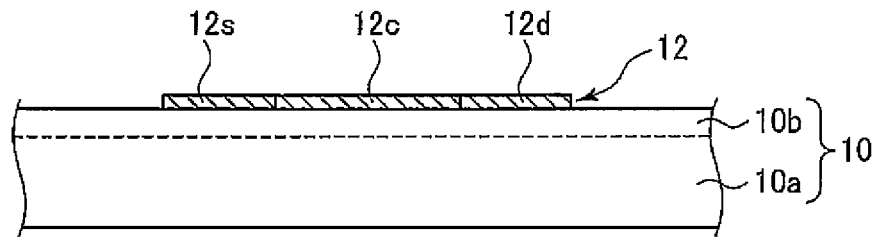
FIGS. 28A, 28B, and 28C are sectional views of the semiconductor device according to the fourth embodiment in the steps of the method of manufacturing the semiconductor device (Part 1)

First, the graphene film 12 of an MLG or an FLG is formed on the silicon substrate with the oxide film by the same steps of the semiconductor device manufacturing method of the second example of the first embodiment, which are illustrated in FIGS. 5A, 5B and 5C and FIGS. 6A and 6B, and the channel region 12c, the source region 12s and the drain region 12d are formed in the graphene film (FIG. 28A).

On the other hand, the multi-layer graphene films 64a, 64b are formed on both surfaces of the metal foil 62 by, e.g., the steps of the method of manufacturing the semiconductor device according to the third embodiment, which are illustrated in FIGS. 25A and 25B.

Figure 28B:
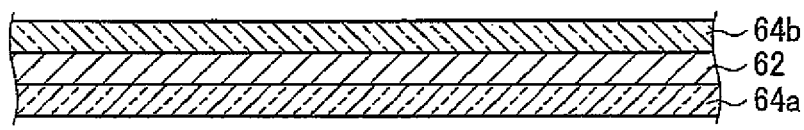

Then, on the silicon substrate 10 with the graphene film 12 formed on illustrated in FIG. 28A, the metal foil 62 with the graphene film 64a, 64b formed on illustrated in FIG. 28B is mounted and sufficiently degassed under, e.g., a pressure of $10^{-2}$ pascal or below for, e.g., 12 hours or more.

Figure 28C:
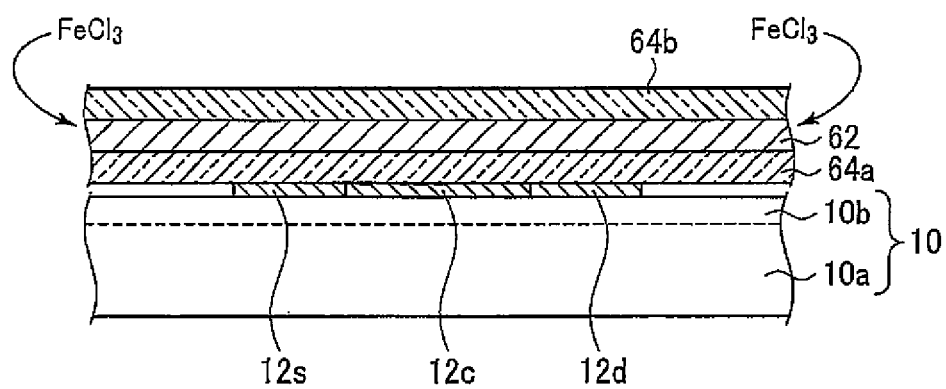

Next, the sample is loaded in an atmosphere of an oxidizer, e.g., an iron chloride content oxidation atmosphere using anhydrous iron chloride ($FeCl_3$) at, e.g., 310 C for, e.g., 6-24 hours (FIG. 28C).

Figure 29A:
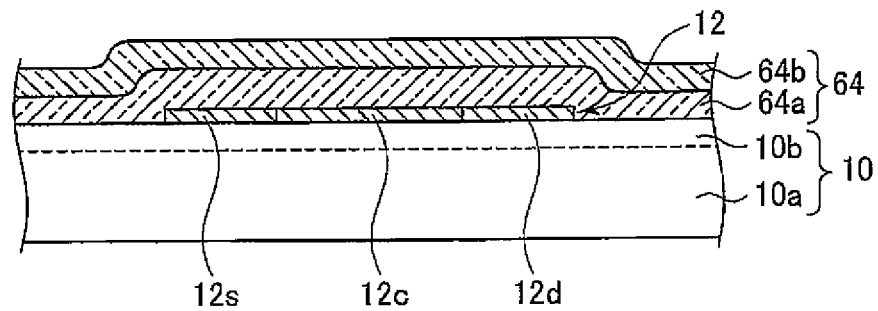
FIGS. 29A, 29B, and 29C are sectional views of the semiconductor device according to the fourth embodiment in the steps of the method of manufacturing the semiconductor device (Part 2)

Thus, the metal foil 62 is removed by the iron chloride, and the multi-layer graphene films 64a, 64b are transferred to the silicon substrate 10 while the molecules of the iron chloride intrude into the films of the multi-layer graphene films 64a, 64b and intercalated (FIG. 29A).

Figure 29B:
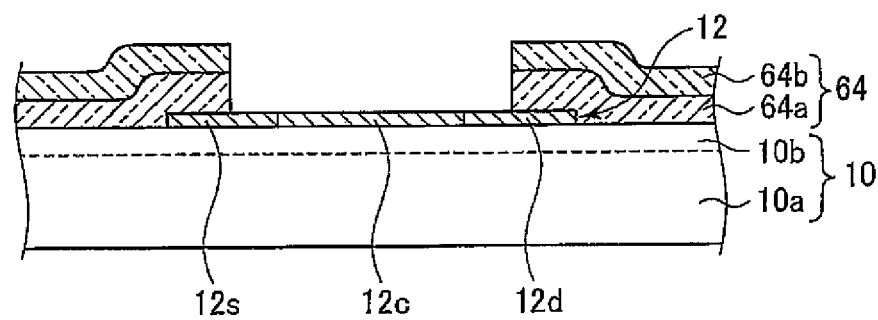

Then, the multi-layer graphene films 64a, 64b are patterned to form the source electrode 70 and the drain electrode 72 respectively contacted to the source region 12s and the drain region 12d while the region containing the channel region 12c is opened (FIG. 29B).

Figure 29C:
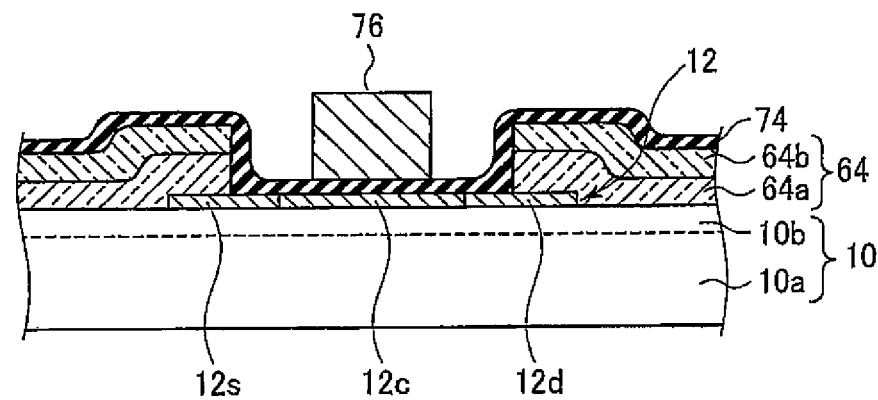

Next, on the entire surface, the gate insulation film 74 is formed (FIG. 29C). The gate insulation film 74 is formed of an about 5 nm-thickness alumina ($Al_2O_3$) film.

Then, on the channel region 12c, the gate electrode 76 is formed with the gate insulation film 74 formed therebetween. The gate electrode 74 is formed of Au/Ti film with an about 20 nm-thickness gold film deposited on an about 5 nm-thickness titanium film.

The graphene manufacturing method described above can manufacture a semiconductor device using graphene film in good condition without generating wrinkles and stresses, and the residues of the resin.

(e) Fifth Embodiment

Figure 30:
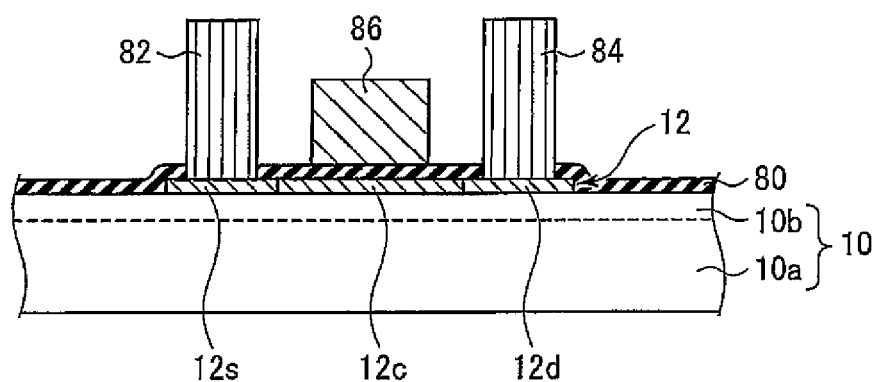
FIG. 30 is a view of the semiconductor device according to a fifth embodiment.

The semiconductor device according to a fifth embodiment and the method of manufacturing the semiconductor device will be described with reference to FIGS. 30 through 31C. FIG. 30 is a view of the semiconductor device according to the present embodiment, and FIG. 31 is sectional views of the semiconductor device according to the fifth embodiment in the steps of the method of manufacturing the semiconductor device, which illustrate the manufacturing method.

(Semiconductor Device)

The semiconductor device according to this embodiment will be described with reference to FIG. 30.

The semiconductor device according to the present embodiment is a TFT using monolayer or few layer graphene film in the channel and carbon nanotubes as the source electrode and drain electrode.

On a silicon substrate 10 with an oxide film, a graphene film 12 is formed.

The substrate 10 with an oxide film is an about 90 nm-thickness silicon oxide film 10b formed on, e.g., an about 380 m thickness.

The graphene film 12 is a MFG or an FLG. The thickness of the graphene film 12 is, e.g., 0.3-5.0 nm.

In the graphene film 12, a source region 12s and a drain region 12d are formed on both sides of a channel region 12c at the center.

The source region 12s and the drain region 12d are doped with nitrogen or others, which is an n-dopant for the n-TFT, and for the p-TFT, are doped with boron or others, which is a p-dopant.

A gate insulation film 80 is formed on the graphene film 12. The gate insulation film 80 is formed of, e.g., an about 5 nm-thickness alumina (Al2O) film.

The source electrode 82 and the drain electrode 84 formed of carbon nanotubes are contacted to the source region 12s and the drain region 12d via openings formed in the gate insulation film 80.

On the channel region 12c of the graphene film 12, a gate electrode 86 is formed with the gate insulation film 80 formed therebetween.

The gate electrode 86 is formed of, e.g., an Au/Ti film with an about 20 nm-thickness gold film stacked on an about 5 nm-thickness titanium film.

The p-TFT and the n-TFT illustrated in FIG. 30 can form a CMOS semiconductor device (not illustrated).

(Method of Manufacturing the Semiconductor Device)

The method of manufacturing the semiconductor device according to this embodiment will be described with reference to FIGS. 31A through 32B.

Figure 31A:
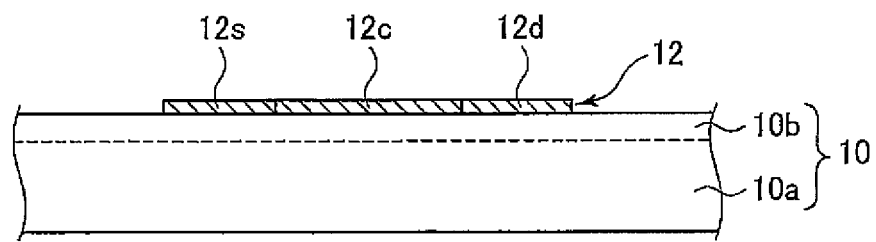
FIGS. 31A, 31B, and 31C are sectional views of the semiconductor device according to the fifth embodiment in the steps of the method of manufacturing the semiconductor device (Part 1)

First, in the same way as in the steps of, e.g., FIGS. 5A, 5B, 5C and FIGS. 6A and 6B of the second example of the method of manufacturing the semiconductor device according to the first embodiment, the graphene film 12 of an MLG OR an MLG is formed on the silicon substrate 10 with an oxide film, and the channel region 12c, the source region 112s and the drain region 12d are formed in the graphene film 12 (FIG. 31A).

Figure 31B:
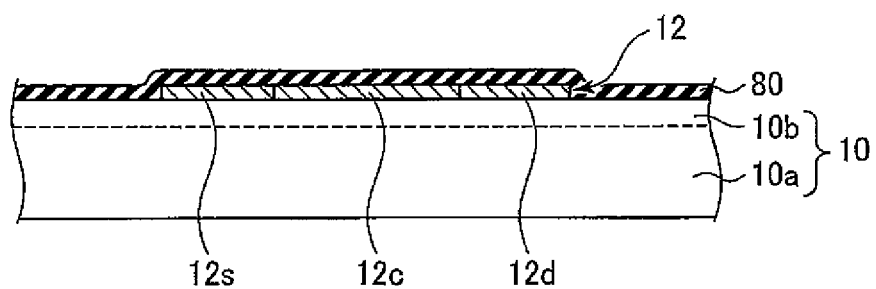
Figure 31C:
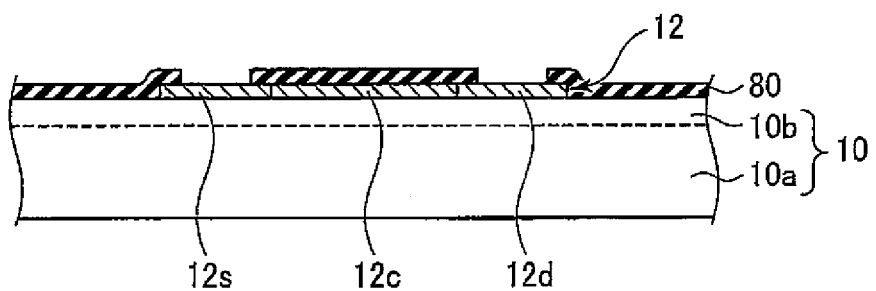
Figure 32A:
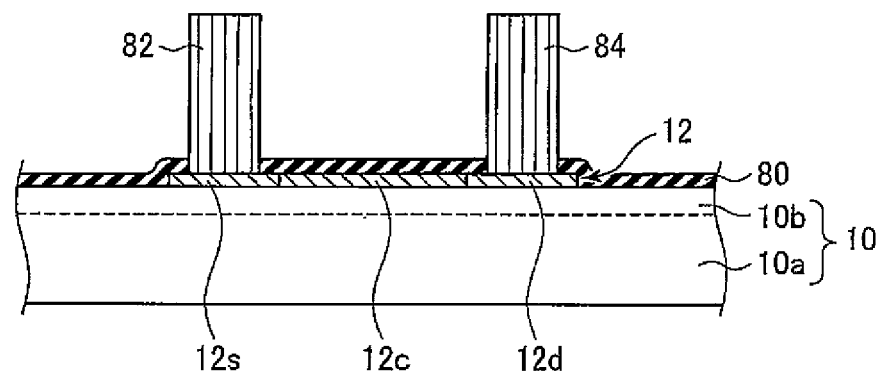
FIGS. 32A and 32B are sectional views of the semiconductor device according to the fifth embodiment in the steps of the method of manufacturing the semiconductor device (Part 2)
Figure 32B:
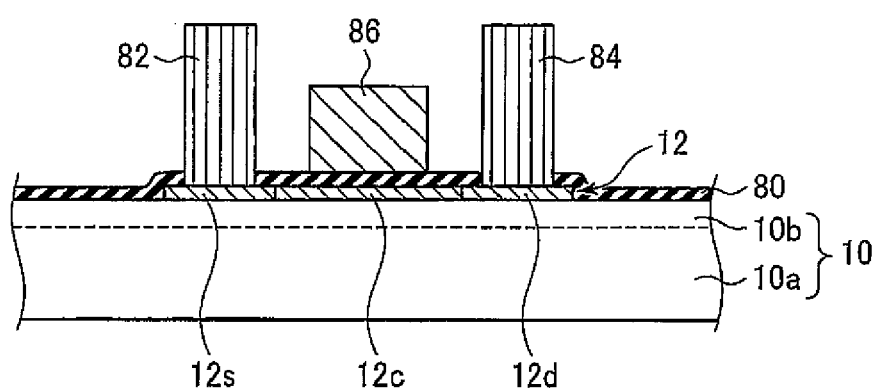

Next, the gate insulation film 80 is formed on the entire surface of the silicon substrate 10 with the graphene film 12 formed on (FIG. 31B). The gate insulation film 80 is, e.g., an about 300 nm-thickness silica (silicon dioxide).

Then, the gate insulation film 80 above the source region 12s and the drain region 12d of the graphene film 12 is opened (FIG. 31C).

Then, on the entire surface, a catalyst film (not illustrated) necessary for the synthesis of the carbon nanotubes is formed, and the unnecessary catalyst film (not illustrated) is removed by, e.g., liftoff to leave the catalyst film (not illustrated) only in the opening of the gate insulation film 80. In this state, the synthesis of the carbon nanotubes is made.

In the synthesis of the carbon nanotubes, the source electrode 82 and the drain electrode 84, of carbon nanotubes are synthesized, e.g., by thermal CVD at 850 C, using cobalt/titanium (2 nm/1 nm) as the catalyst film.

In the thermal CVD, for example, acetylene gas is used as the raw material, and the as the dilution gas, hydrogen and argon are used. The flow rate of argon gas is, e.g., 4000 sccm, the flow rate of hydrogen is, e.g., 500 sccm, and the flow rate of the methane gas is, e.g., 50 sccm.

Then, carbon nanotubes which are to be the source electrode 82 and the drain electrode 84 are formed to be contacted to the source region 12s and the drain region 12d of the graphene film 12.

Then, on the channel region 12 of the graphene film 12, the gate electrode 86 is formed with the gate insulation film 80 formed therebetween. The gate electrode 86 is an Au/Ti film with an about 20 nm thickness gold film stacked on, e.g., an 5 nm-thickness titanium film.

The gate electrode 86 may be formed of carbon nanotubes as well as are the source electrode 82 and the drain electrode 84.

The graphene manufacturing method described above can manufacture a semiconductor device using graphene film in good condition without generating wrinkles and stresses, and the residues of the resin.

(f) Sixth Embodiment

Figure 33:
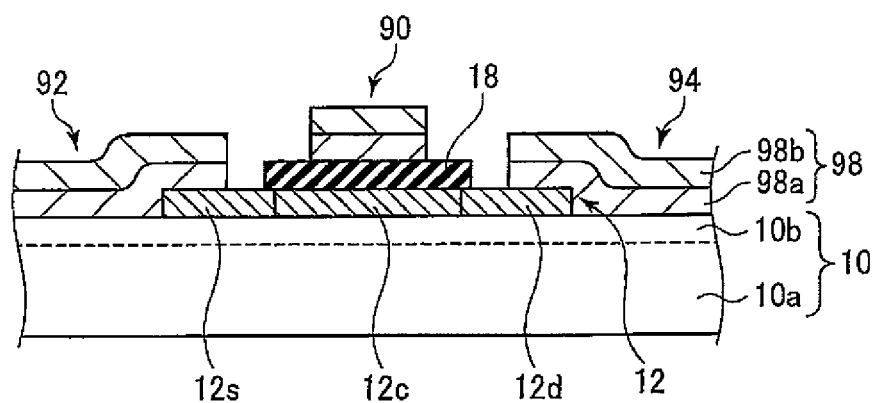
FIG. 33 is a view of the semiconductor device according to a sixth embodiment.

The semiconductor device according to a sixth embodiment and the method of manufacturing the semiconductor device will be described with reference to FIG. 33 through 35B. FIG. 33 is a view of the semiconductor device according to the sixth embodiment, and FIGS. 34A through 35B are sectional views of the semiconductor device in the steps of the method of manufacturing the semiconductor device according to the sixth embodiment, which illustrate the manufacturing method.

(Semiconductor Device)

The semiconductor device according to this embodiment will be described with FIG. 33.

The semiconductor device according to this embodiment is a thin film transistor using graphene film in the channel and also in the electrodes and the interconnects.

A graphene film 12 is formed on a silicon substrate 10 with an oxide film.

The silicon substrate 10 with an oxide film is, e.g., an about 90 nm-thickness silicon oxide film 10b formed on an about 380 m-thickness silicon substrate 10.

The graphene film 12 is formed of FLG (Few Layer Graphene) or multi-layer graphene. The thickness of the graphene film 12 is, e.g., 0.9-50 nm.

In the graphene film 12, a source region 12a and a drain region 12d are formed on both sides of a channel region 12c at the center.

The source region 12s and the drain region 12d are formed with nitrogen or others, which is an-dopant and for the p-TFT, are doped with boron or others, which is a p-dopant. The dopant can be gas molecules or organic molecules.

On the channel region 12c of the graphene film 12, a gate electrode 90 is formed with a gate insulation film formed therebetween. The gate insulation film 18 is formed of, e.g., an about 5 nm-thickness alumna ($Al_2O_3$) film.

In the source region 12s and the drain region 12d, of the graphene film 12, a source electrode 92 and a drain electrode 94 are respectively formed.

The gate electrode 90, the source electrode 92 and the drain electrode 94 are formed of multi-layer graphene film. The gate electrode 90, the source electrode 92 and the drain electrode 94 are respectively connected to electrodes (not illustrated).

The p-TFT and the n-TFT of the structure illustrated in FIG. 33 can form a CMOS thin film semiconductor device (not illustrated).

(Method of Manufacturing the Semiconductor Device)

The method of manufacturing the semiconductor device according to this embodiment will be described with reference to FIGS. 34A through 35B.

Figure 34A:
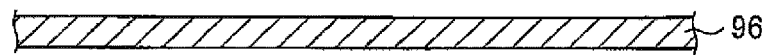
FIGS. 34A, 34B, and 34C are sectional views of the semiconductor device according to the sixth embodiment in the steps of the method of manufacturing the semiconductor device (Part 1)

First, a metal foil 96 is prepared (FIG. 34A). The metal foil 96 is, e.g., an about 1 m-thickness nickel foil of an about 99 purity.

Figure 34B:
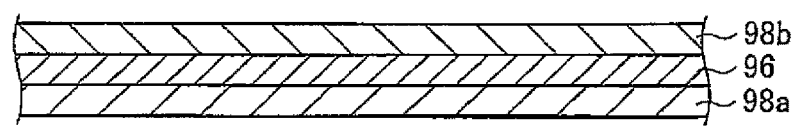

Then, on both surfaces of the metal foil 96, multi-layer graphene films 98a, 98b are synthesized (FIG. 34B).

The multi-layer graphene films 98a, 98b are synthesized on both surfaces of the metal foil 96 by, e.g., thermal CVD at 1000 C. In the thermal CVD, for example, methane gas is used as the raw material, and as the dilution gas, hydrogen and argon are used. The flow rate of the argon gas is, e.g., 4000 sccm, the flow rate of the hydrogen is, e.g., 500 sccm, and the flow rate of the methane gas is, e.g., 50 sccm.

Figure 34C:
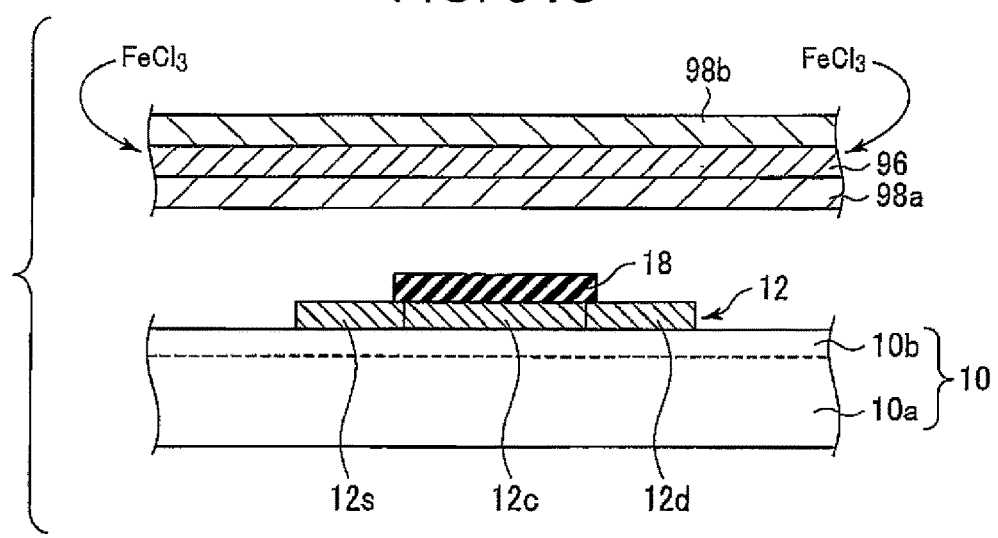

Then, the multi-layer graphene films 98a, 98b formed on both surfaces of the metal foil 96 are mounted on a silicon substrate 10 with an oxide film 10 separately prepared and with a graphene film 12 and a gate insulation film 18 formed on, and is sufficiently degassed under a pressure of $10^{-2}$ pascal or below at, e.g., for 12 hours (FIG. 34C).

Then, the sample is loaded in an oxidation atmosphere of an oxidizer, e.g., an iron chloride content oxidation atmosphere using anhydrous iron chloride ($FeCl_3$) at, e.g., 310 C for, e.g., 6-24 hours (FIG. 34C).

Figure 35A:
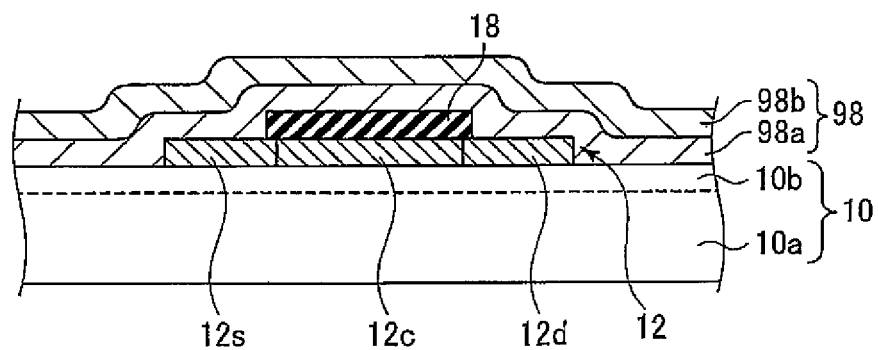
FIGS. 35A and 35B are sectional views of the semiconductor device according to the sixth embodiment in the steps of the method of manufacturing the semiconductor device (Part 2).
Figure 35B:
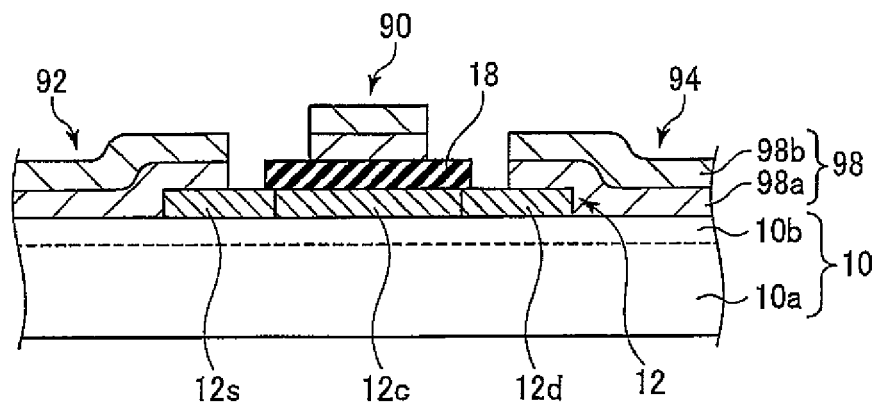

Thus, the metal foil 96 is removed by the iron chloride, and the graphene film 98 of the multi-layer graphene films 98a, 988b are transferred to the silicon substrate 10 with an oxide film while the molecules of the iron chloride intrude into the multi-layer graphene films 98a, 98b and intercalated (FIG. 35A).

Then, the graphene film 98 formed of the multi-layer graphene films 98a, 98b is patterned to form the gate electrode 90, the source electrode 92 and the drain electrode 94.

(g) Modified Embodiments

The present invention is not limited to the above-described embodiments and can cover other various modifications.

For example, the material and the conditions for the removal of the catalyst metal film and/or the intercalation of the graphene film are not limited to the material and conditions described in the above-described embodiments.

For example, the material can be iron chloride ($FeCl_3$), niobium chloride ($NbCl_5$), copper chloride ($CuCl_2$), ytterbium chloride ($YbCl_3$), cobalt chloride ($CoCl_2$) or others.

As the conditions for these materials, they may be retained at their boiling points or temperatures lower than the boiling points by about 10-30%. The boiling points of iron chloride ($FeCl_3$), niobium chloride ($NbCl_5$), copper chloride ($CuCl_2$), ytterbium chloride ($YbCl_3$), cobalt chloride ($CoCl_2$) are respectively 350 C, 250 C, 1000 C, 700 C and 1000 C.

The material can be not only chlorides but also other various materials, for example, other sublimating chlorides, oxides, sulfides and nitrides.

The material for the intercalation can be alkaline metal, alkaline earth, rare earth, halogen or others.

As the alkali metal, lithium, kalium, potassium rubidium, cesium or others is used and intercalated by being vapor-deposited on a sample by vapor deposition, such as size getter or others, under an ultrahigh vacuum of 10-6 Torr or below and being heated at about 200-500 C.

As the alkaline earth, magnesium, calcium, strontium, barium or others is used and intercalated by being held at the boiling point, around 700 C, 860 c, 800 C and 900 C under a vacuum of 1 Pa or below.

As the rare earth, samarium, europium, thulium, ytterbium or others is used and intercalated by being held at a temperature lower than the boiling point, 850 C, 749 C, 959 C, 630 C by about 10-30 under a vacuum of 10-4 Torr or below.

As the halogen, iodine, bromine or others can be used. For example, iodine and bromine, which vaporize even at the room temperature, is, in the liquid state, sealed in a container, and a substrate with the graphene film formed on is held in said container. The vaporized halogen molecules are intercalated during several days. To speed up the intercalation, the substrate is held at about 100 C.

With the materials other than halogen, the catalyst metal cannot be removed. Then, the catalyst metal is removed in an oxidation atmosphere using iron chloride.

A material for the intercalation can be organic molecules. For example, fluorination TCNQ, such as F4TCNQ (TFTCNQ), may be used. As the conditions, the material is vapor-deposited in graphene film by resistance heating or electron beam vapor deposition in a vacuum at about 300 C and intercalated.

Other materials to be used as the material for the intercalation can be nitrogen dioxide, titanium, potassium, ammonia, etc.

In the above-described embodiments, the graphene film is synthesized by thermal CVD but may be synthesized by other CVD, e.g., remote plasma CVD or plasma CVD.

In the above-described embodiments, the raw material gas for the graphene film is methane gas, but another gas, e.g., a hydrocarbon gas, such as ethylene gas or others, alcohol, such as ethanol or others, benzene, or a solid material, such as amorphous carbon or others may be used.

In the above-described embodiments, the catalyst metal for synthesizing the graphene film, cobalt, copper, nickel are used, but another metal, such as platinum, gold or others, an alloy containing at least one of these metals, or a compound, such as carbide, oxide, nitride or others may be used.

In the above-described embodiments, the catalyst metal is deposited by sputtering and electron beam vapor deposition, but MBE (Molecular Beam Epitaxy) or others may be used.

In the above-described embodiments, zinc oxide is used as the transparent semiconductor, but a transparent oxide semiconductor, a tow dimensional semiconductor, such as boron nitride (h-BN), molybdenum disulfide (MoS2) or others may be used.

In the above-described embodiments, as the channel material other than graphene transparent semiconductor, silicon is used, but a fourth group semiconductor, such as germanium or others, a III-V OR II-VI compound semiconductor, such as gallium arsenide, indium phosphate or others, or a compound semiconductor, such as InGaAs or others may be used.

In the above-described embodiments, the transparent substrate and the silicon substrate are used, but flexible substrates, as of plastics or others, nay be used.

In the above-described embodiments, as the source electrode and the drain electrode, titanium/gold and the carbon material are used, but titanium/palladium, palladium, titanium/nickel, nickel, gold, cobalt, titanium, nickel silicide, cobalt silicide, germanium silicide, titanium silicide, silicon carbide, an alloy containing one of these materials or a compound, such as carbide, oxide nitride or others, may be used.

The constituent materials and the manufacturing conditions, etc. of the respective films in the processing of synthesizing the graphene film in the above-described embodiments are one example and can be modified or changed suitably in accordance with the technical common sense of the skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a graphene film, comprising:
    forming a catalyst metal film on a substrate;
    after forming of the catalyst metal, synthesizing a graphene film on the catalyst metal film; and
    after synthesizing of the grapheme film, removing the catalyst metal film in an iron chloride content oxidation atmosphere of an anhydrous iron chloride and then transferring the graphene film to the substrate on which the catalyst metal film was formed,
    wherein, the catalyst metal film is removed in the iron chloride content oxidation atmosphere of an anhydrous iron chloride at a temperature of 310° C. after 12-24 hours.

2. A method of manufacturing a graphene film, comprising:
    forming a catalyst metal film on a substrate;
    after forming a catalyst metal, synthesizing a graphene film on the catalyst metal film;
    after synthesizing of the graphene film, removing the catalyst metal film in an iron chloride content oxidation atmosphere of an anhydrous iron chloride and then transferring the graphene film to the substrate on which the catalyst metal film was formed;
    after transferring of the graphene film, mounting another substrate on the substrate with the graphene film transferred to; and
    after mounting of said another substrate, removing the substrate in an oxidation atmosphere of an oxidizer and transferring the graphene film to said another substrate,
    wherein, the catalyst metal film is removed in the iron chloride content oxidation atmosphere of an anhydrous iron chloride at a temperature of 310° C. after 12-24 hours.

3. A method of manufacturing a graphene film according to claim 1, wherein
    in the transferring the graphene film to the substrate, the graphene film is intercalated.

4. A method of manufacturing a graphene film according to claim 2, wherein
    in the transferring the graphene film to the substrate, the graphene film is intercalated.

5. A method of manufacturing a graphene film according to claim 1, further comprising:
    intercalating the graphene film.

6. A method of manufacturing a graphene film according to claim 2, further comprising:
    intercalating the graphene film.

7. A method of manufacturing a graphene film according to claim 1, wherein
    the transferring the graphene film to the substrate is made in an atmosphere degassed to a prescribed pressure or below.

8. A method of manufacturing a graphene film according to claim 2, wherein
    the transferring the graphene film to the substrate is made in an atmosphere degassed to a prescribed pressure or below.

9. A method of manufacturing a graphene film according to claim 1, wherein
    the graphene film is monolayer graphene or few layer graphene.

10. A method of manufacturing a graphene film according to claim 1, wherein
    the graphene film is multi-layer graphene.

11. A method of manufacturing a graphene film according to claim 1, wherein
    the catalyst metal film contains any one of cobalt, iron, copper nickel, platinum and gold, or any one of alloy, carbide, oxide and nitride containing at least one of said metals.

12. A method of manufacturing a graphene film according to claim 1, wherein
    the oxidizer contains any one of iron chloride, niobium chloride, copper chloride, ytterbium chloride, cobalt chloride, alkaline metal, alkaline earth metal, rare earth and halogen.

13. A method of manufacturing a semiconductor device comprising:
    forming the graphene film on the substrate, on which the catalyst metal film was formed, by the method of manufacturing a graphene film according to claim 1;
    patterning the graphene film and forming a channel of the graphene film;
    forming, on the substrate, a source electrode and a drain electrode contacted to the channel;
    forming a gate insulation film on the channel; and
    forming a gate electrode on the gate insulation film.

14. A method of manufacturing a semiconductor device comprising:
- forming the graphene film on the substrate, on which the catalyst metal film was formed, by the method of forming a graphene film according to claim 1;
- patterning the graphene film and forming interconnects of the graphene film; and
- forming electrodes contacted to the interconnects.

\* \* \* \* \*